(12) United States Patent
Tang et al.

(10) Patent No.: US 9,703,302 B2
(45) Date of Patent: Jul. 11, 2017

(54) MIXED MODE COMPENSATION CIRCUIT

(71) Applicant: RICHTEK TECHNOLOGY CORPORATION, Chupei, HsinChu (TW)

(72) Inventors: Chien-Fu Tang, Hsinchu (TW); Jiun-Hung Pan, Taipei (TW); Isaac Y. Chen, Hsinchu (TW)

(73) Assignee: RICHTEK TECHNOLOGY CORPORATION, Chupei, Hsinchu (TW)

(*) Notice: Subject to any disclaimer, the term of this patent is extended or adjusted under 35 U.S.C. 154(b) by 0 days.

(21) Appl. No.: 15/201,440

(22) Filed: Jul. 2, 2016

(65) Prior Publication Data

US 2016/0327967 A1 Nov. 10, 2016

Related U.S. Application Data

(60) Division of application No. 14/192,431, filed on Feb. 27, 2014, which is a continuation-in-part of application No. 13/672,125, filed on Nov. 8, 2012, now Pat. No. 9,104,216.

(51) Int. Cl.
*H02M 3/157* (2006.01)
*G05F 1/10* (2006.01)
*H03M 1/38* (2006.01)
*H02M 1/00* (2006.01)

(52) U.S. Cl.
CPC ............. *G05F 1/10* (2013.01); *H02M 3/157* (2013.01); *H03M 1/38* (2013.01); *H02M 2001/0025* (2013.01)

(58) Field of Classification Search
CPC .. G05F 1/10; G05F 1/46; G05F 1/625; H02M 3/157; H02M 2001/0025
See application file for complete search history.

(56) References Cited

U.S. PATENT DOCUMENTS

| | | | |
|---|---|---|---|
| 4,094,480 A * | 6/1978 | Nixon | G05D 1/042 244/180 |
| 7,190,291 B2 * | 3/2007 | Markowski | H02M 1/082 341/122 |
| 7,952,337 B2 * | 5/2011 | Gurcan | H02M 3/156 323/282 |
| 2011/0115458 A1 * | 5/2011 | Schafmeister | H02M 3/156 323/284 |
| 2012/0119801 A1 * | 5/2012 | Hsieh | H03L 7/087 327/156 |
| 2015/0180497 A1 * | 6/2015 | Jackson | H03F 3/19 330/291 |
| 2015/0214845 A1 * | 7/2015 | Kawashima | H02M 3/33523 363/21.18 |

* cited by examiner

*Primary Examiner* — Matthew Nguyen
(74) *Attorney, Agent, or Firm* — Tung & Associates

(57) ABSTRACT

A mixed mode compensation circuit for a power converter generate a digital signal according to a reference signal and a feedback signal which is related to the output voltage of the power converter, convert the digital signal into a first analog signal, offset the first analog signal with a variable offset value to generate a second analog signal, and filter out high-frequency components of the second analog signal to generate a third analog signal for stable output voltage of the power converter. The mixed mode compensation does not require large capacitors, and thus the circuit can be integrated into an integrated circuit.

18 Claims, 19 Drawing Sheets

MIXED MODE COMPENSATION CIRCUIT

CROSS REFERENCE

The present invention is a continuation-in-part application of U.S. Ser. No. 13/672,125, filed on Nov. 8, 2012.

This is a Divisional of a co-pending application Ser. No. 14/192,431, filed on Feb. 27, 2014.

BACKGROUND OF THE INVENTION

Field of Invention

The present invention is related generally to a power converter and, more particularly, to a compensation circuit and method for a power converter.

Description of Related Art

A feedback loop of a power converter needs a compensation circuit to compensate the phase margin for stability of the feedback loop. Conventional analog compensation circuits include an EA type compensation circuit 10 as shown in FIG. 1 or a gm type compensation circuit 14 as shown in FIG. 2. Referring to FIG. 1, the EA type compensation circuit 10 includes an error amplifier 12, a capacitor C1 and a resistor R3 serially connected between an inverting input terminal and an output terminal of the error amplifier 12, and a resistor R4 parallel connected with the serially connected capacitor C1 and resistor R3. The error amplifier 12 amplifies the difference between a feedback signal Vfb and a reference signal Vref to generate a signal Vcomp which is then provided to a power converter to stabilize the output voltage Vo of the power converter. The resistors R3 and R4 and the capacitor C1 are configured to compensate the signal Vcomp. Some applications may not include the resistor R4 shown in FIG. 1. Referring to FIG. 2, the gm type compensation circuit 14 includes a transconductance amplifier 16, a resistor R3 and a capacitor C1 serially connected between an output terminal of the transconductance amplifier 16 and a ground terminal GND, and a capacitor C2 parallel connected with the serially connected resistor R3 and capacitor C1. The transconductance amplifier 16 converts the difference between a feedback signal Vfb and a reference signal Vref into a current Icomp. The resistor R3 and the capacitors C1 and C2 are configured to generate a compensation signal Vcomp according to the current Icomp. For a control integrated circuit (IC), using an external compensation circuit requires a pin of the control IC. In order to reduce the number of the pins of a control IC, more and more solutions integrate a compensation circuit into a control IC, for example, U.S. Pat. No. 7,504,888. Generally speaking, the gm type compensation circuit 14 is easier to be integrated into a control IC, while this type of solutions also has many limitations. Generally, a control IC for a high switching frequency DC/DC power converter has a pole and a zero point that are both higher than 10 KHz, so it is easier to integrate the compensation circuit into the control IC. However, in low-bandwidth applications such as power factor correction (PFC) power converters or other similar PFC control ICs or power converters, the compensation circuit 14 requires large capacitors C1 and C2. Under consideration of costs and chip area, it is much difficult to integrate the large capacitors C1 and C2 into the control IC completely. More specifically, the input voltage of a PFC power converter is an alternating-current (AC) voltage with an AC frequency of 60 Hz, so a control IC needs a low gain and a pole and a zero point of a low frequency to achieve a low-bandwidth loop to filter out the AC frequency. Therefore, the compensation circuit 14 requires large capacitors C1 and C2 for compensation to make the signal Vcomp vary slowly so as to filter out the AC frequency. However, the large capacitors C1 and C2 satisfying the requirements cannot be implemented in a control IC, the control IC is required a pin to be connected to external large capacitors C1 and C2. If it is desired to shrink the capacitors C1 and C2 so that they can be integrated into a control IC, then it needs the current Icomp to be reduced to the nanoampere level or the picoampere level; however, such a small current is much sensitive to the process and cannot be controlled accurately, so it is difficult to integrate the large capacitors C1 and C2 into a control IC.

Since it is difficult to integrate an analog compensation circuit into a control IC, many digital compensation circuits are proposed, for example, U.S. Pat. Nos. 7,743,266 and 7,894,218. Although these digital compensation circuits can be integrated into the control IC of a PFC power converter, usually a complex digital signal processing (DSP) algorithm is needed and thus a large chip area is required, resulting in increased costs and chip size. On the other hand, the slowly varying signal Vcomp will make a power converter unable to rapidly respond to a load transient, resulting in a large voltage drop or overshoot of the output voltage Vo.

SUMMARY OF THE INVENTION

In one aspect, the present invention provides a mixed mode compensation circuit for a power converter, comprising: a digital signal generator for generating a first pole, the digital signal generator generating a digital signal according to a reference signal and a feedback signal which is related to an output voltage of the power converter; and a digital-to-analog converter coupled to the digital signal generator, for converting the digital signal into a first analog signal.

In one embodiment, the mixed mode compensation circuit further comprises: an offset injector coupled to the digital-to-analog converter for generating a zero, the offset injector providing a variable offset value determined by a difference between the feedback signal and the reference signal to offset the first analog signal to generate a second analog signal.

In one embodiment, the mixed mode compensation circuit further comprises: a low-pass filter coupled to the digital-to-analog converter for generating a second pole, the low-pass filter being configured to filter out high-frequency components of the first analog signal to generate a second analog signal.

In one embodiment, the mixed mode compensation circuit further comprises: an offset injector coupled to the digital-to-analog converter, for providing a variable offset value determined by a difference between the feedback signal and the reference signal to offset the first analog signal to generate a second analog signal; and a low-pass filter coupled to the offset injector, the low-pass filter being configured to filter out high-frequency components of the second analog signal to generate a third analog signal for the power converter to stabilize the output voltage.

In one embodiment, the mixed mode compensation circuit further comprises: a low-pass filter coupled to the digital-to-analog converter, the low-pass filter being configured to filter out high-frequency components of the first analog signal to generate a second analog signal; and an offset injector coupled to the low-pass filter, for providing a variable offset value determined by a difference between the feedback signal and the reference signal to offset the second analog signal to generate a third analog signal for the power converter to stabilize the output voltage.

In one embodiment, the mixed mode compensation circuit further comprises: an offset injector coupled to the digital signal generator, for providing a variable offset value determined by a difference between the feedback signal and the reference signal to offset the digital signal to generate a second analog signal; and an adder for adding the first analog signal and the second analog signal to generate a third analog signal for the power converter to stabilize the output voltage.

In one embodiment, the mixed mode compensation circuit further comprises a low-pass filter coupled to an output of the adder.

In one embodiment, the mixed mode compensation circuit further comprises: an offset injector coupled to the digital signal generator, for providing a variable offset value determined by a difference between the feedback signal and the reference signal to offset the digital signal to generate a second analog signal; a low-pass filter coupled to the offset injector, the low-pass filter being configured to filter out high-frequency components of the first analog signal to generate a second analog signal; and an adder for adding the first analog signal and the third analog signal to generate a fourth analog signal for the power converter to stabilize the output voltage.

In another aspect, the present invention provides a mixed mode compensation circuit for a power converter, comprising: a digital signal generator for generating a first digital signal and a second digital signal according to a reference signal and an output voltage feedback signal which is related to an output voltage of the power converter; a digital offset injector coupled to the digital signal generator, for generating a variable offset according to the second digital signal; an adder for adding the first digital signal and the variable offset or for adding the first digital signal and a signal related to the variable offset; and a digital-to-analog converter coupled to the adder, for converting an output of the adder or a signal related to the output of the adder into an analog signal.

In one embodiment, the mixed mode compensation circuit further comprises: a low-pass filter coupled to the digital-to-analog converter for filtering out high-frequency components of the analog signal.

In one embodiment, the mixed mode compensation circuit further comprises: (1) a digital filter coupled between the digital offset injector and the adder for filtering the variable offset to generate the signal related to the variable offset; or (2) a digital filter coupled between the adder and the digital-to-analog converter for filtering the output of the adder to generate the signal related to the output of the adder.

In one embodiment, the digital offset injector feedback controls a clock signal of the digital signal generator.

In another aspect, the present invention provides a mixed mode compensation circuit for a power converter, comprising: a digital signal generator for generating a first digital signal and a second digital signal according to a reference signal and an output voltage feedback signal which is related to an output voltage of the power converter; a digital offset injector coupled to the digital signal generator, for generating a variable offset according to the second digital signal; a first digital-to-analog converter coupled to the digital signal generator, for converting the first digital signal into a first analog signal; a second digital-to-analog converter coupled to the digital signal generator, for converting the second digital signal into a second analog signal; and an adder for adding the first analog signal and the second analog signal or adding a signal related to the first analog signal and the second analog signal.

In one embodiment, the mixed mode compensation circuit further comprises: a low-pass filter coupled between the first digital-to-analog converter and the adder or coupled to the output of the adder.

In another aspect, the present invention provides a mixed mode compensation circuit for a power converter, comprising: a digital signal generator for generating a first digital signal according to a reference signal and an output voltage feedback signal which is related to an output voltage of the power converter; a digital filter coupled to the digital signal generator, for filtering the first digital signal; and a digital-to-analog converter coupled to the digital filter, for converting an output of the digital filter into an analog signal.

In one embodiment, the digital signal generator includes: a SAR-ADC (Successive Approximation Register Analog to Digital Converter) for generating an up/down signal according to the output voltage feedback signal and the reference signal; and an up/down counter having an output controlled by the up/down signal to correspondingly increase or decrease.

In one embodiment, the digital offset injector generates a digital number or code corresponding to $\alpha \cdot (Vfb1-Vref1)$, wherein $\alpha$ is a positive real number; Vfb1 is the output voltage feedback signal; and Vref1 is the reference signal.

In one embodiment, the digital filter includes a D flip-flop or a moving average circuit.

The objectives, technical details, features, and effects of the present invention will be better understood with regard to the detailed description of the embodiments below.

DESCRIPTION OF THE PREFERRED EMBODIMENTS

Figure 1:
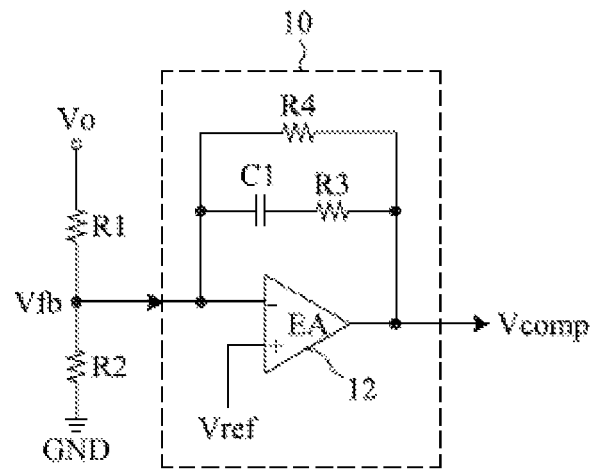
FIG. 1 is a circuit diagram of a conventional EA type compensation circuit.
Figure 2:
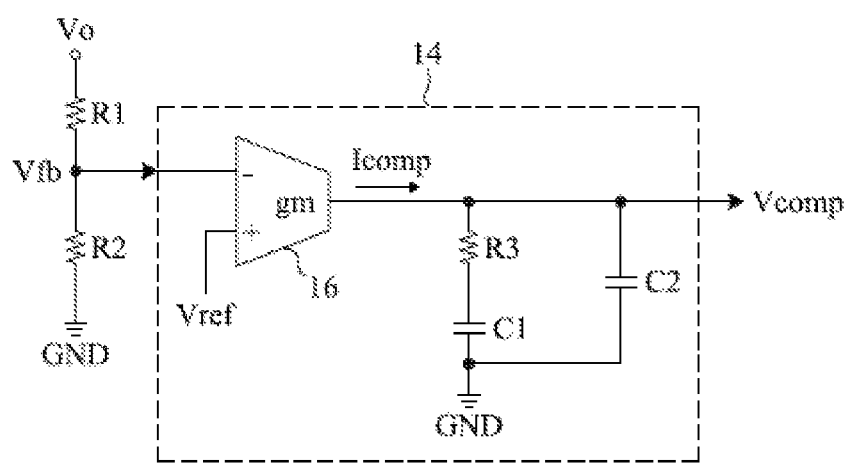
FIG. 2 is a circuit diagram of a conventional gm type compensation circuit.
Figure 3A:
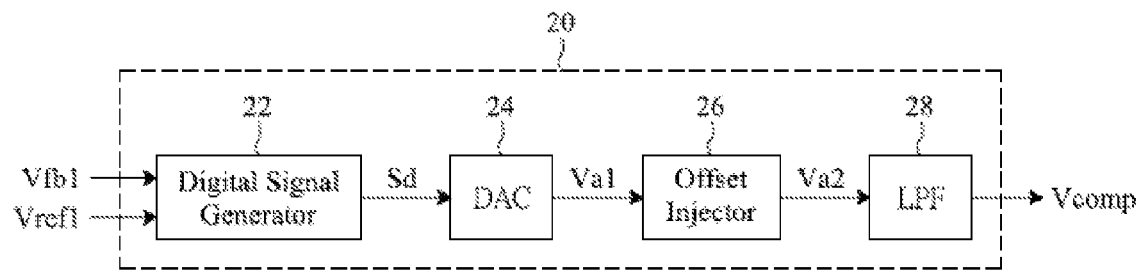
FIG. 3A shows a mixed mode compensation circuit according to the present invention.

Referring to FIG. 3A, a mixed mode compensation circuit 20 according to the present invention is disclosed, which is applicable to various types of power converters such as a DC/DC power converter and a PFC power converter. In the mixed mode compensation circuit 20, a digital signal generator 22 generates a digital signal Sd according to a reference signal Vref1 and a feedback signal Vfb1 related to the output voltage of a power converter, a digital-to-analog converter (DAC) 24 converts the digital signal Sd into a first signal Va1 which is an analog signal, an offset injector 26 provides a variable offset value to offset the first signal Va1 to generate a second signal Va2 which is also an analog signal, and a low-pass filter (LPF) 28 filters out the high-frequency components of the second signal Va2 to generate a third signal Vcomp which is then provided to stabilize the output voltage of the power converter. The mixed mode compensation circuit 20 simulates the gm type compensation circuit 14 shown in FIG. 2. As is well known, the gm type compensation circuit 14 provides two poles and a zero point, and the mixed mode compensation circuit 20 can also provide two poles and a zero point. In detail, the digital signal generator 22 and the DAC 24 may be viewed as a first pole generator/compensator for providing a first pole, the offset injector 26 may be viewed as a zero point generator/compensator for providing a zero point, and the LPF 28 may be viewed as a second pole generator/compensator for providing a second pole.

Figure 3B:
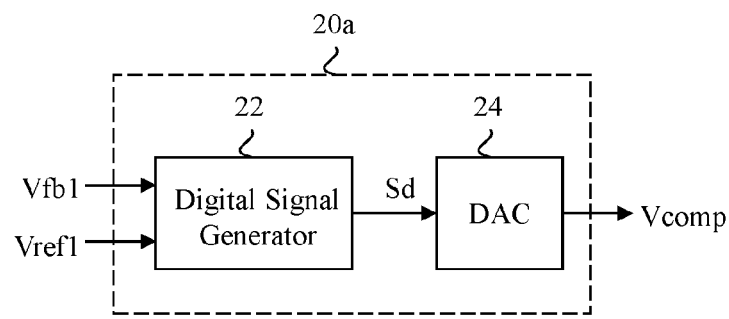
FIGS. 3B-3H show other embodiments of mixed mode compensation circuits according to the present invention.
Figure 3C:
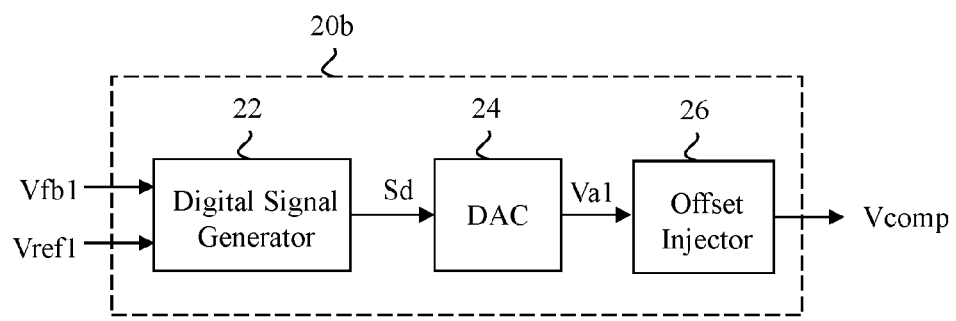
Figure 3D:
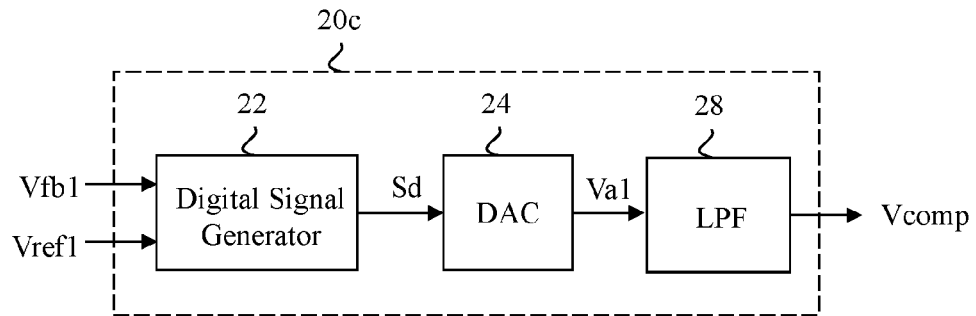
Figure 3E:
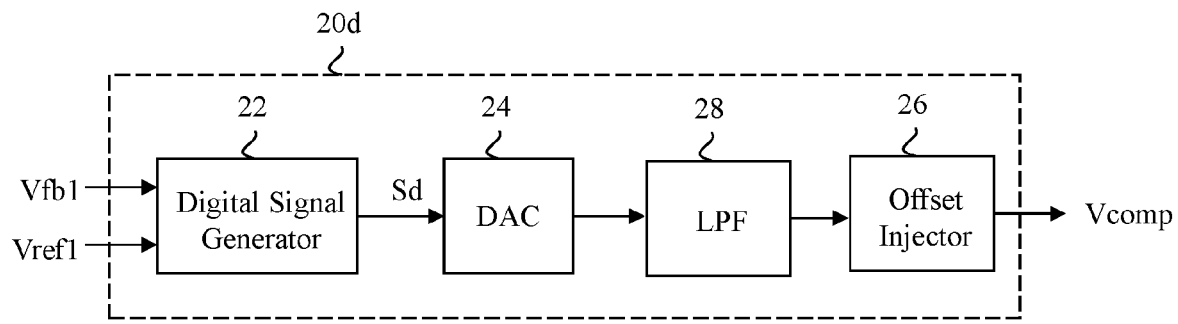
Figure 3F:
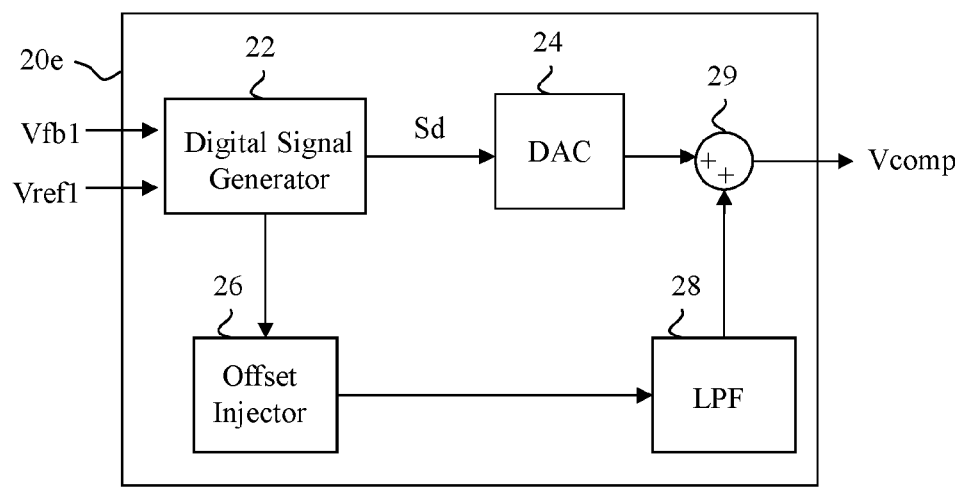
Figure 3G:
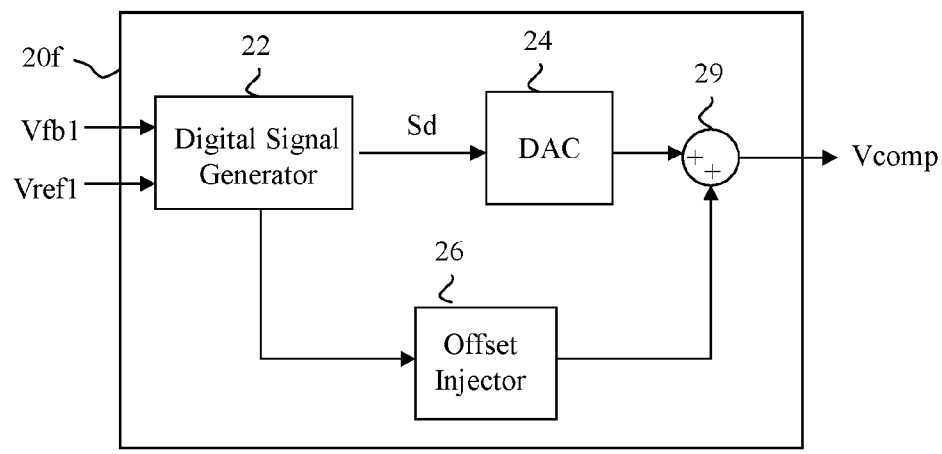
Figure 3H:
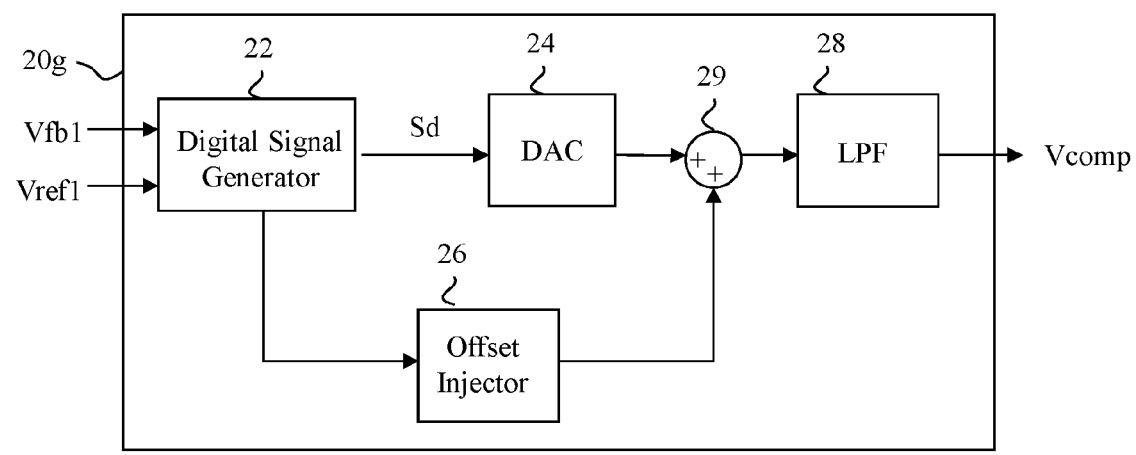

Note that it may not be necessarily required to generate/compensate two poles and one zero. In some applications, it may only be required to generate/compensate one pole, or one pole and one zero, or two poles. FIGS. 3B-3D show mixed mode compensation circuits 20a, 20b and 20c corresponding to these applications. Furthermore, in the embodiment generating/compensating two poles and one zero, it is not necessary for the LPF 28 to be located after the offset injector 26 and connected in series with the digital signal generator 22 and the DAC 24; it can be arranged otherwise. For example, FIG. 3E shows an embodiment wherein the LPF 28 is located before the offset injector 26; FIG. 3F shows an embodiment wherein the offset injector 26 and the LPF 28 are located in a separated path to provide a compensation for a zero point and a second pole, and an adder 29 adds the output signal from the DAC 24 with the compensation signal generated in the separated path; FIG. 3G shows an embodiment which is similar to the embodiment of FIG. 3F but the LPF 28 is omitted. In additional to the above arrangements, the LPF 28 can be located at other locations such as but not limited to the location after the adder 29 (coupled to the output of the adder 29), as shown in the embodiment of FIG. 3H.

Figure 4:
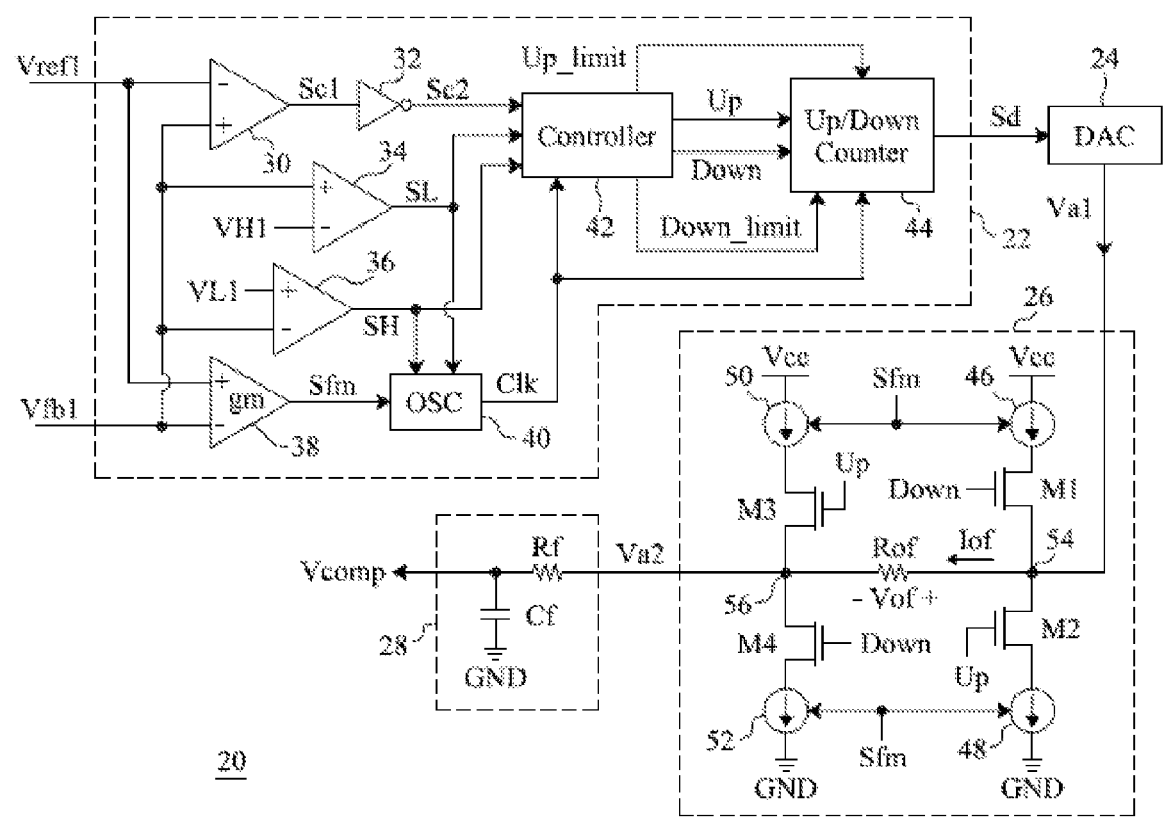
FIG. 4 is a circuit diagram of an embodiment for the mixed mode compensation circuit shown in FIG. 3A.

FIG. 4 is a circuit diagram of a first embodiment for the mixed mode compensation circuit 20 shown in FIG. 3A. In order to realize the first pole of a low frequency, the digital signal generator 22 and the DAC 24 are used to simulate the transconductance amplifier 16 of the gm type compensation circuit 14 shown in FIG. 2. In the digital signal generator 22 shown in FIG. 4, a comparator 30 compares the feedback signal Vfb1 with the reference signal Vref1 to generate a comparison signal Sc1, an inverter 32 inverts the comparison signal Sc1 to generate a signal Sc2 for a controller 42, an oscillator 40 provides a clock signal Clk for the controller 42 and an up/down counter 44, and the controller 42 samples the signal Sc2 responsive to the clock signal Clk to assert control signals Up and Down for the up/down counter 44 to adjust the digital signal Sd. When the sampling result indicates that the feedback signal Vfb1 is greater than the reference signal Vref1, the controller 42 asserts the control signal Down to signal the up/down counter 44 to decrease the digital signal Sd by one bit so as to decrease the output power of the power converter. When the sampling result indicates that the feedback signal Vfb1 is smaller than the reference signal Vref1, the controller 42 asserts the control signal Up to signal the up/down counter 44 to increase the digital signal Sd by one bit so as to increase the output power of the power converter. The up/down counter 44 samples the control signals Up and Down from the controller 42 responsive to the clock signal Clk to adjust the digital signal Sd. The DAC 24 converts the digital signal Sd into the first analog signal Va1. The DAC 24 is a relatively common circuit, and thus the internal circuit and operations thereof will not be further described herein. When the clock signal Clk is at a low frequency, the sampling frequency is relatively low and the digital signal Sd varies slowly, which makes the third analog signal Vcomp outputted by the mixed mode compensation circuit 20 vary slowly. This effect is the same as that in the case where the gm type compensation circuit 14 uses large capacitors C1 and C2.

If the third analog signal Vcomp outputted by the mixed mode compensation circuit 20 still varies slowly when a load transient occurs to the power converter, then the power converter cannot make a response rapidly, causing the output voltage Vo of the power converter to have a large voltage drop or overshoot. For this issue, the digital signal generator 22 shown in FIG. 4 further includes a hysteresis comparator 34 to compare the feedback signal Vfb1 with a threshold VH1 to generate a comparison signal SH for the controller 42, a hysteresis comparator 36 to compare the feedback signal Vfb1 with a threshold VL1 to generate a comparison signal SL for the controller 42, and an operational transconductance amplifier 38 to amplify the difference $\Delta V$ between the feedback signal Vfb1 and the reference signal Vref1 to generate a frequency adjustment signal Sfm which is then provided to the oscillator 40 to adjust the frequency of the clock signal Clk. When the difference $\Delta V$ between the feedback signal Vfb1 and the reference signal Vref1 increases, the frequency adjustment signal Sfm will increase the frequency of the clock signal Clk to increase the sampling frequency so as to speed up the variation of the digital signal Sd and the slew rate of the third analog signal Vcomp. When the feedback signal Vfb1 is greater than the threshold VH1 or smaller than the threshold VL1, the hysteresis comparator 34 or 36 asserts the comparison signal SL or SH for the oscillator 40 to increase the frequency of the clock signal Clk to a maximum value such that the digital signal Sd is increased or decreased at a maximum frequency. Furthermore, when the feedback signal Vfb1 is greater than the threshold VH1, the controller 42 responsive to the comparison signal SL asserts a control signal Down_limit for the up/down counter 44 such that the up/down counter 44 decreases the digital signal Sd to a minimum value at the maximum frequency to thereby increase the slew rate of the third analog signal Vcomp, thus rapidly reducing the output power of the power converter and rapidly reducing the output voltage Vo of the power converter to a preset level. Likewise, when the feedback signal Vfb1 is smaller than the threshold VL1, the controller 42 responsive to the comparison signal SH asserts a control signal Up_limit for the up/down counter 44 such that the up/down counter 44 increases the digital signal Sd to a maximum value at the maximum frequency to thereby increase the slew rate of the third analog signal Vcomp, thus rapidly increasing the output power of the power converter and rapidly increasing the output voltage Vo of the power converter to the preset level. In other embodiments, when the feedback signal Vfb1 is greater than the threshold VH1 or smaller than the threshold VL1, the up/down counter 44 can also adjust the digital signal Sd responsive to the comparison signal SL or SH to the minimum value or the maximum value immediately. When a load transient occurs, the difference $\Delta V$ between the feedback signal Vfb1 and the reference signal Vref1 increases, so the sampling frequency of the controller 42 and the up/down counter 44 is increased to thereby increase the slew rate of the third analog signal Vcomp. Moreover, when the feedback signal Vfb1 is greater than the threshold VH1 or smaller than the threshold VL1, the digital signal Sd can be decreased to the minimum value or increased to the maximum value immediately or at the maximum frequency, so the load transient response of the power converter can be improved effectively.

Figure 5:
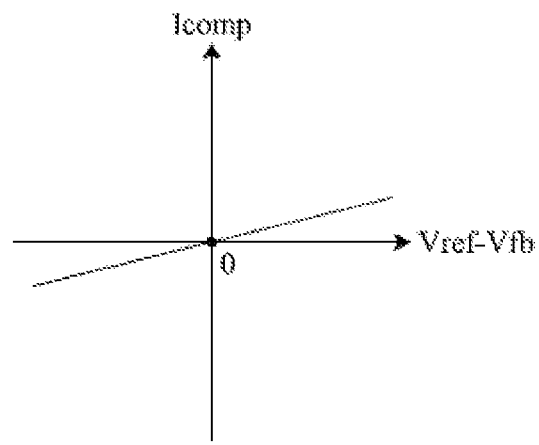
FIG. 5 is a current-voltage characteristic curve of the transconductance amplifier shown in FIG. 2.

FIG. 5 is a current-voltage characteristic curve of the transconductance amplifier 16 shown in FIG. 2. From the circuit shown in FIG. 2, it may have $$Ce \times Vcomp = Icomp \times T, \quad [EQ\text{-}1]$$

where Ce is the equivalent capacitance of the capacitors C1 and C2, and T is the duration that the current Icomp is asserted. From the equation EQ-1, it is further derived $$Icomp/Ce = Vcomp/T. \quad [EQ\text{-}2]$$

Figure 6:
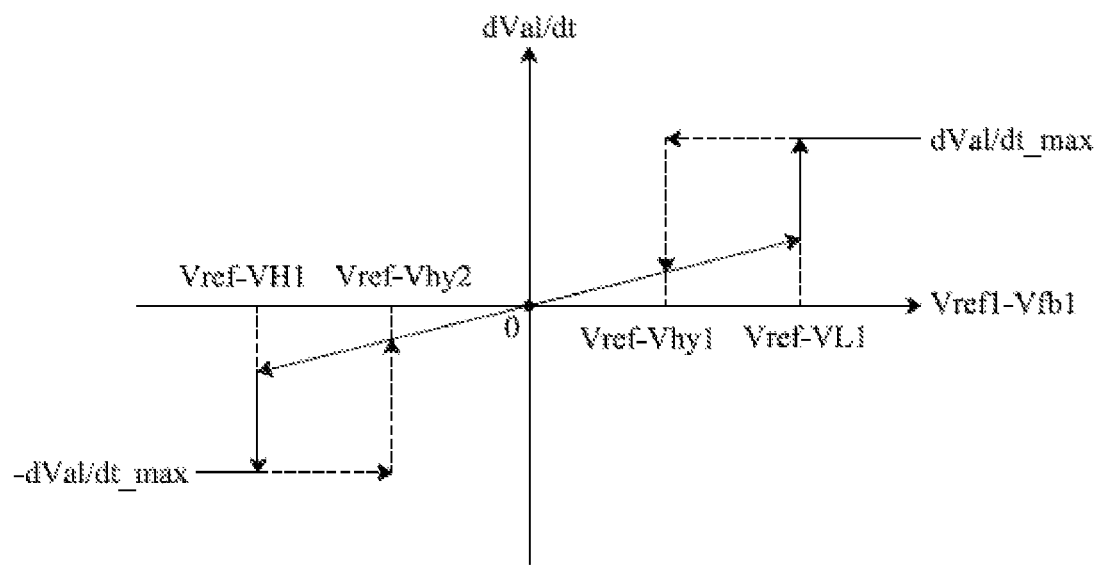
FIG. 6 is a characteristic curve of the voltage variation rate dVa1/dt of the first signal Va1 shown in FIG. 4 versus the voltage Vref1−Vfb1.

As can be known from the equation EQ-2, because the current Icomp and the capacitance Ce determine the voltage variation rate dVcomp/dt and the capacitance Ce is a constant value, the current Icomp is directly proportional to the voltage variation rate dVcomp/dt. Therefore, the Y axis in FIG. 5 may also be viewed to represent the voltage variation rate dVcomp/dt. The digital signal generator 22 and the DAC shown in FIG. 3A that simulate the transconductance amplifier 16 can also achieve a similar voltage variation rate. For example, FIG. 6 is a characteristic curve of the voltage variation rate dVa1/dt (i.e., the slew rate) of the first signal Va1 of the DAC 24 shown in FIG. 4 versus the input voltage Vfb1 of the digital signal generator 22. Apart of this curve between the thresholds VL1 and VH1 is the same as the curve shown in FIG. 5, and there are hysteresis regions at two ends of this curve. When the feedback signal Vfb1 is increased to be greater than the threshold VH1, the digital signal Sd is decreased at the maximum sampling frequency, so the first signal Va1 has a maximum negative voltage variation rate –dVa1/dt_max and the voltage variation rate dVa1/dt of the first signal Va1 will not return to the original level until the feedback signal Vfb1 is decreased to be smaller than a hysteresis threshold Vhy1. Likewise, when the feedback signal Vfb1 is decreased to be smaller than the threshold VL1, the digital signal Sd is increased at the maximum frequency of the clock signal Clk, so the first signal Va1 has a maximum positive voltage variation rate dVa1/dt_max and the voltage variation rate dVa1/dt of the first signal Va1 will not return to the original level until the feedback signal Vfb1 is increased to be greater than a hysteresis threshold Vhy2.

In the embodiment shown in FIG. 4, the offset injector 26 includes a current source 46 and a switch M1 connected in series between a power terminal Vcc and a first terminal 54 of a resistor Rof, a current source 48 and a switch M2 connected in series between the first terminal 54 of the resistor Rof and a ground terminal GND, a current source 50 and a switch M3 connected in series between the power terminal Vcc and a second terminal 56 of the resistor Rof, and a current source 52 and a switch M4 connected in series between the second terminal 56 of the resistor Rof and the ground terminal GND. The switches M1 and M4 are controlled by the control signal Down from the controller 42, and the switches M2 and M3 are controlled by the control signal Up from the controller 42. Controlling the switches M1, M2, M3 and M4 may determine the direction of the current Iof of the resistor Rof. The current sources 46, 48, 50 and 52 determine the magnitude of the current Iof according to the frequency adjustment signal Sfm from the operational transconductance amplifier 38 so as to determine a variable offset value Vof for offsetting the first signal Va1 to generate the second signal Va2. Because the frequency adjustment signal Sfm is associated with the difference $\Delta V$ between the feedback signal Vfb1 and the reference signal Vref1, the variable offset value Vof also varies with the difference $\Delta V$. In other embodiments, the current sources 46, 48, 50 and 52 may also determine the current Iof according to other signals associated with the difference $\Delta V$ instead. The low-pass filter 28 shown in FIG. 4 includes an RC filter established by a resistor Rf and a capacitor Cf, and filters the second signal Va2 to generate the third signal Vcomp. From the viewpoint of physical significance of the control loop, the zero point of the gm type compensation circuit 14 serves as a phase lead compensation and the second pole is similar to a low-pass filter, so the mixed mode compensation circuit 20 of the present invention uses the offset injector 26 to provide an instantaneous voltage variation to simulate the function of the zero point and uses the RC filter to achieve the second pole.

Figure 7:
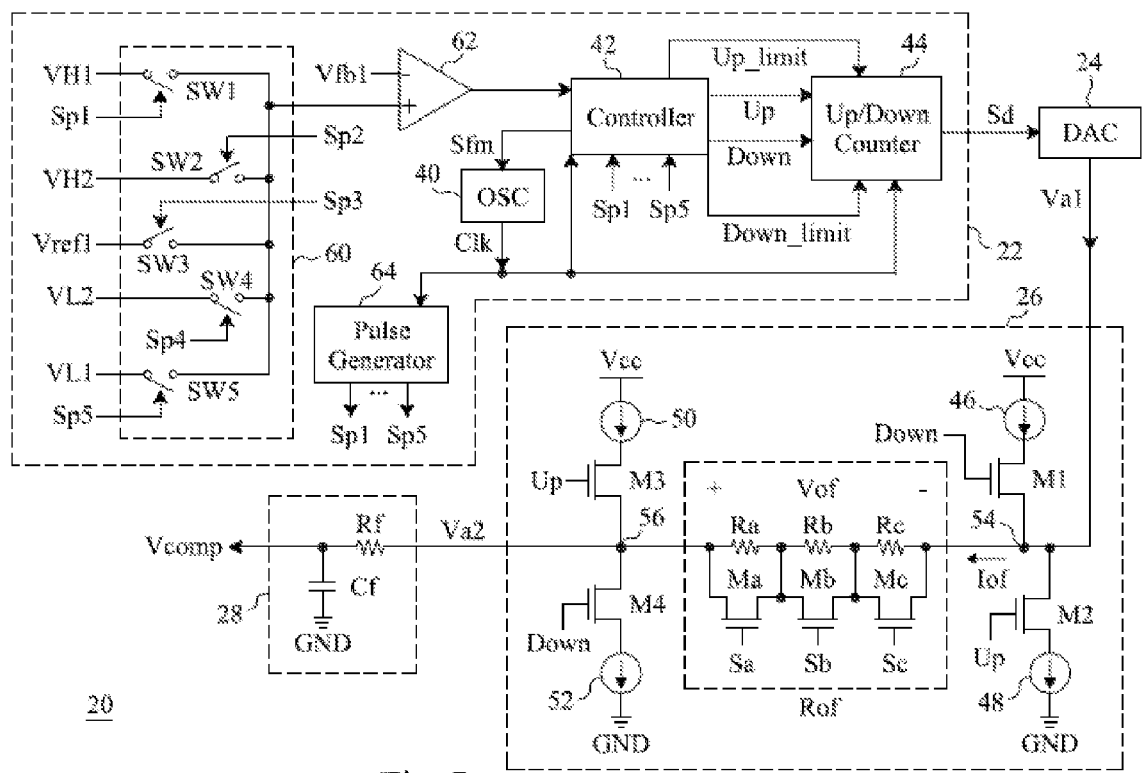
FIG. 7 is a circuit diagram of another embodiment for the mixed mode compensation circuit shown in FIG. 3A.
Figure 8:
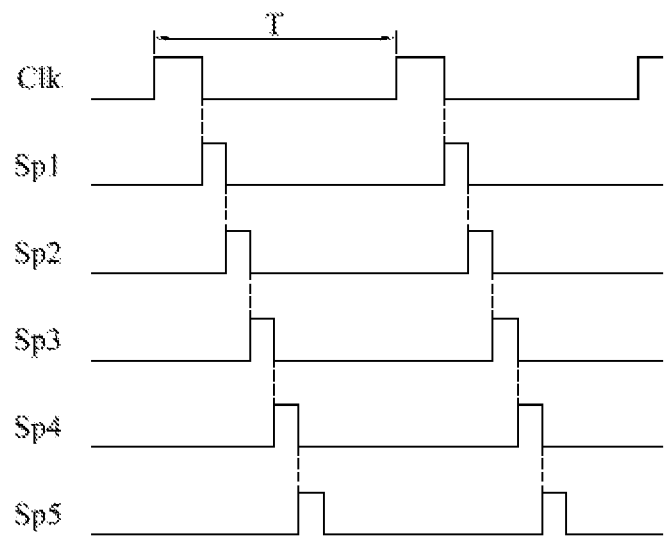
FIG. 8 is a timing diagram of the clock signal and pulse signals shown in FIG. 7.

FIG. 7 is a circuit diagram of a second embodiment for the mixed mode compensation circuit 20 shown in FIG. 3A. In the digital signal generator 22, a multiplexer 60 is configured to switch a threshold VH1, a threshold VH2, the reference signal Vref1, a threshold VL2 and a threshold VL1 in turn to a non-inverting input terminal of a comparator 62 responsive to pulse signals Sp1-Sp5, respectively, where VH1>VH2>Vref1>VL2>VL1, the comparator 62 has an inverting input terminal to receive the feedback signal Vfb1 and compares the feedback signal Vfb1 with VH1, VH2, Vref1, VL1 and VL2 one by one to generate a comparison signal for the controller 42, and the controller 42 samples the comparison signal from the comparator 62 responsive to a clock signal Clk and the pulse signals Sp1-Sp5, and asserts control signals Up and Down for the up/down counter 44 according to the sampling result so as to increase or decrease the digital signal Sd. The controller 42 also identifies whether the feedback signal Vfb1 is greater than the maximum threshold VH1 or smaller than the minimum threshold VL1 according to the comparison results of the comparator 62. If the feedback signal Vfb1 is greater than the maximum threshold VH1, then the controller 42 asserts a control signal Down_limit such that the up/down counter 44 decreases the digital signal Sd to a minimum value immediately or at a maximum frequency so as to increase the slew rate of the third analog signal Vcomp. If the feedback signal Vfb1 is smaller than the minimum threshold VL1, then the controller 42 asserts a control signal Up_limit such that the up/down counter 44 increases the digital signal Sd to a maximum value immediately or at the maximum frequency so as to increase the slew rate of the third analog signal Vcomp. The controller 42 also provides a frequency adjustment signal Sfm for the oscillator 40 according to the comparison result of the comparator 62 to adjust the frequency of the clock signal Clk. The greater the difference between the feedback signal Vfb1 and the reference signal Vref1 is, the higher the frequency of the clock signal Clk will be, and this can increase the slew rate of the third analog signal Vcomp and speed up the load transient response. When the feedback signal Vfb1 is greater than the maximum threshold VH1 or smaller than the minimum threshold VL1, the frequency of the clock signal Clk will be increased to a maximum value by the frequency adjustment signal Sfm to increase the sampling frequency of the controller 42 and the up/down counter 44. A pulse generator 64 generates the pulse signals Sp1-Sp5 as shown in FIG. 8 responsive to the clock signal Clk, and provides the pulse signals Sp1-Sp5 to the multiplexer 60 in turn in each period T of the clock signal Clk.

In the offset injector 26 shown in FIG. 7, the resistor Rof in FIG. 4 is replaced by a variable resistor controlled by a switch, and the resistance of the variable resistor varies with the difference ΔV between the feedback signal Vfb1 and the reference signal Vref1. The current sources 46, 48, 50 and 52 supply fixed currents, so the current Iof passing through the variable resistor Rof is constant. In this embodiment, the variable resistor Rof includes three resistors Ra, Rb and Rc connected in series, and the resistors Ra, Rb and Rc are connected in parallel with switches Ma, Mb and Mc, respectively. Signals Sa, Sb and Sc generated according to the difference ΔV control the switches Ma, Mb and Mc, respectively, to adjust the resistance of the variable resistor Rof, thereby generating the variable offset value Vof varying with the difference ΔV for offsetting the first signal Va1 to generate the second signal Va2.

Figure 9:
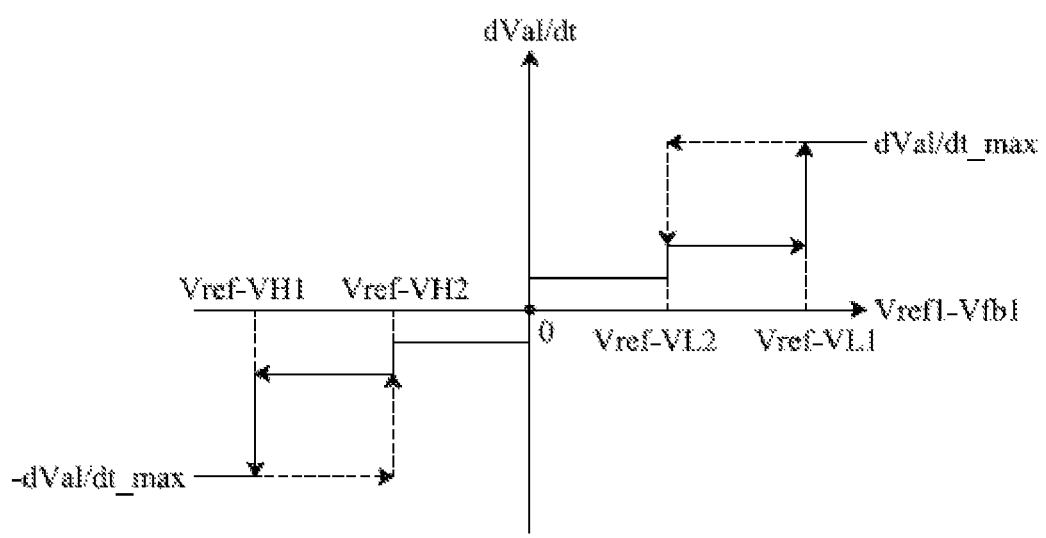
FIG. 9 is a characteristic curve of the voltage variation rate dVa1/dt of the first signal Va1 shown in FIG. 7 versus the voltage Vref1−Vfb1.

FIG. 9 is a characteristic curve of the voltage variation rate dVa1/dt of the first signal Va1 of the DAC 24 shown in FIG. 7 versus the input voltage Vfb1 of the digital signal generator 22. When the feedback signal Vfb1 is increased to be greater than the threshold VH1, the digital signal Sd is decreased at the maximum frequency, so the first signal Va1 has a maximum negative voltage variation rate −dVa1/dt_max and the voltage variation rate of the first signal Va1 will not return to the original level until the feedback signal Vfb1 is decreased to be smaller than the threshold VH2. Likewise, when the feedback signal Vfb1 is decreased to be smaller than the threshold VL1, the digital signal Sd is increased at the maximum frequency, so the first signal Va1 has a maximum positive voltage variation rate dVa1/dt_max and the variation rate of the first signal Va1 will not return to the original level until the feedback signal Vfb1 is increased to be greater than the hysteresis threshold VL2. In the embodiment shown in FIG. 7, as the number of the thresholds that are set increases, the curve of FIG. 9 approaches the curve of FIG. 6.

Figure 10:
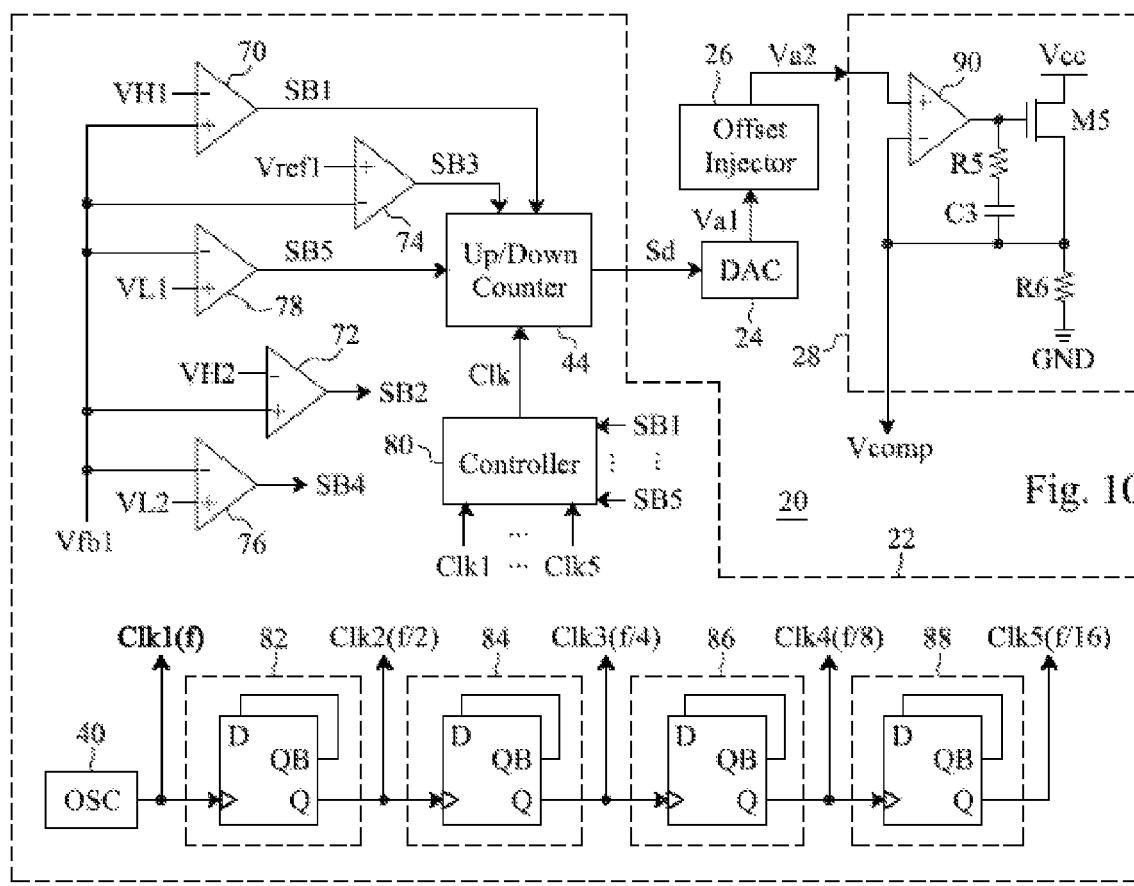
FIG. 10 is a circuit diagram of another embodiment for the mixed mode compensation circuit shown in FIG. 3A.

FIG. 10 is a circuit diagram of a third embodiment for the mixed mode compensation circuit 20 shown in FIG. 3A. In the digital signal generator 22, a comparator 70 compares the feedback signal Vfb1 with a threshold VH1 to generate a comparison signal SB1, a comparator 72 compares the feedback signal Vfb1 with a threshold VH2 to generate a comparison signal SB2, a comparator 74 compares the feedback signal Vfb1 with the reference signal Vref1 to generate a comparison signal SB3, a comparator 76 compares the feedback signal Vfb1 with a threshold VL2 to generate a comparison signal SB4, a comparator 78 compares the feedback signal Vfb1 with a threshold VL1 to generate a comparison signal SB5, a controller 80 selects one of clock signals Clk1, Clk2, Clk3, Clk4 and Clk5 as the clock signal Clk provided to an up/down counter 44 according to the comparison signals SB1, SB2, SB3, SB4 and SB5 in the way that when the feedback signal Vfb1 is greater than the maximum threshold VH1 or smaller than the minimum threshold VL1, the controller 80 selects the clock signal Clk1 of the maximum frequency to provide to the up/down counter 44, the up/down counter 44 samples the comparison signal SB3 responsive to the clock signal Clk and increase or decrease the digital signal Sd by one bit according to the sampling result in the way that when the feedback signal Vfb1 is greater than the maximum threshold VH1 or smaller than the minimum threshold VL1, the up/down counter 44 decreases the digital signal Sd to a minimum value or increases the digital signal Sd to a maximum value immediately or at the maximum frequency responsive to the comparison signal SB1 or SB5 so as to increase the slew rate of the third signal Vcomp, an oscillator 40 provides the clock signal Clk1 of a frequency f, a frequency divider 82 divides the frequency f of the clock signal Clk1 to generate the clock signal Clk2 of a frequency f/2, a frequency divider 84 divides the frequency f/2 of the clock signal Clk2 to generate the clock signal Clk3 of a frequency f/4, a frequency divider 86 divides the frequency f/4 of the clock signal Clk3 to generate the clock signal Clk4 of a frequency f/8, and a frequency divider 88 divides the frequency f/8 of the clock signal Clk4 to generate the clock signal Clk5 of a frequency f/16. In this mixed mode compensation circuit, the characteristic curve of the voltage variation rate dVa1/dt of the first signal Va1 of the DAC 24 versus the input voltage Vfb1 of the digital signal generator 22 is as shown FIG. 9.

In FIG. 10, the LPF 28 includes a low-bandwidth operational amplifier 90 having a non-inverting input terminal to receive the second signal Va2 from the offset injector 26 and an inverting input terminal electrically connected to the output terminal Vcomp of the LPF 28, a resistor R5 and a compensation capacitor C3 serially connected between the output terminal of the operational amplifier 90 and the output terminal Vcomp of the LPF 28 to stabilize the third signal Vcomp, a transistor M5 connected between a power terminal Vcc and the output terminal Vcomp of the LPF 28 and having a gate electrically connected to the output terminal of the operational amplifier 90, and a resistor R6 connected between the output terminal Vcomp of the LPF 28 and a ground terminal GND.

Although FIGS. 4, 7 and 10 show embodiments of the mixed mode compensation circuit 20 corresponding to FIG. 3A, it can be readily understood that the mixed mode compensation circuits 20a-20g shown in FIGS. 3B-3H can be embodied by using the circuit components in the mixed mode compensation circuit 20 shown in FIGS. 4, 7 and 10.

Figure 11:
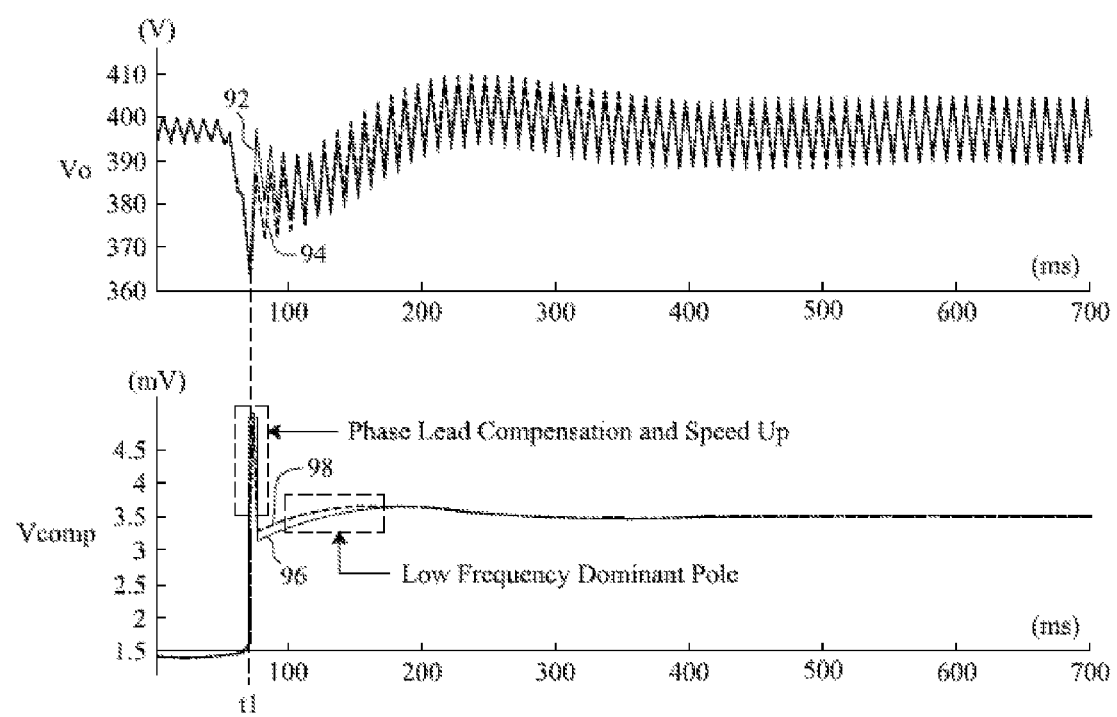
FIG. 11 shows the output voltages of the power converter and the signals Vcomp that are generated by using the gm type analog compensation circuit shown in FIG. 2 and the mixed mode compensation circuit according to the present invention, respectively.

FIG. 11 illustrates the effect of the present invention, in which waveforms 92 and 96 are the output voltage Vo of a power converter and the signal Vcomp, respectively, that are generated by using the gm type analog compensation circuit 14 shown in FIG. 2, while waveforms 94 and 98 are the output voltage Vo of a power converter and the third signal Vcomp, respectively, that are generated by using the mixed mode compensation circuit 20 of the present invention, and are almost the same as the waveforms 92 and 96 generated by using the gm type analog compensation circuit 14. Moreover, when a load transient occurs at time t1, the mixed mode compensation circuit 20 also has a good transient response. Therefore, the mixed mode compensation circuit 20 can indeed replace the conventional analog compensation circuit 14. The mixed mode compensation circuit 20 can reduce the frequency of the clock signal Clk to achieve the same effect of stabilizing the signal Vcomp as that provided by large capacitors C1 and C2 in the analog compensation circuit 14, and thus the mixed mode compensation circuit 20 needs not use large capacitors C1 and C2, so it can be easily integrated into a control IC to reduce the number of the pins. Due to combining an analog circuit and a digital circuit together, the mixed mode compensation circuit 20 is simpler and thereby occupies a smaller chip area, and eliminates the need for a complex DSP algorithm as compared to the digital compensation circuit. This can simplify the design and reduce the costs.

Figure 12A:
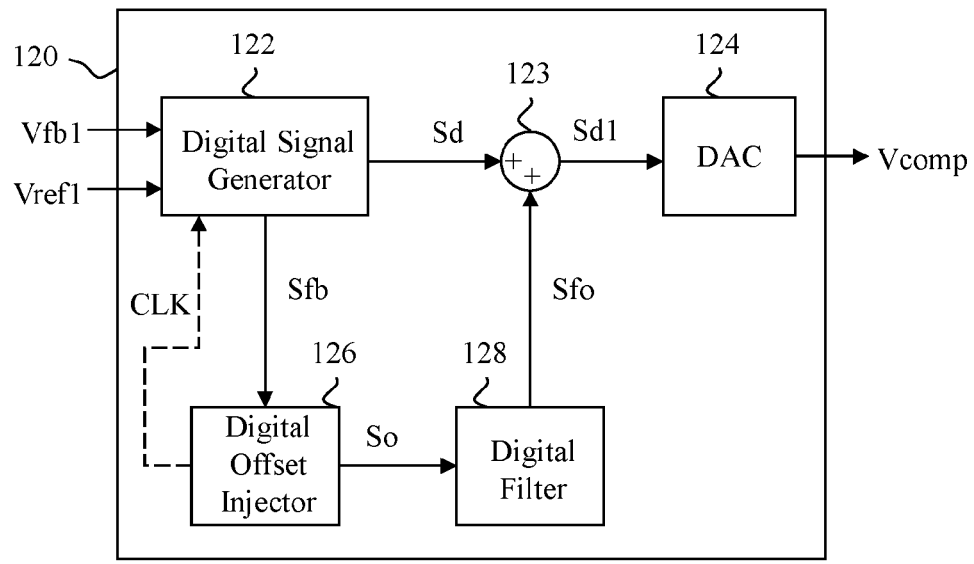
FIGS. 12A-12G show several other embodiments of the mixed mode compensation circuit according to the present invention.

FIG. 12A shows a mixed mode compensation circuit 120 according to another embodiment of the present invention. FIGS. 12B-12E show mixed mode compensation circuits 120a-120d according to other embodiments of the present invention, which are variations of the mixed mode compensation circuit 120.

Figure 12B:
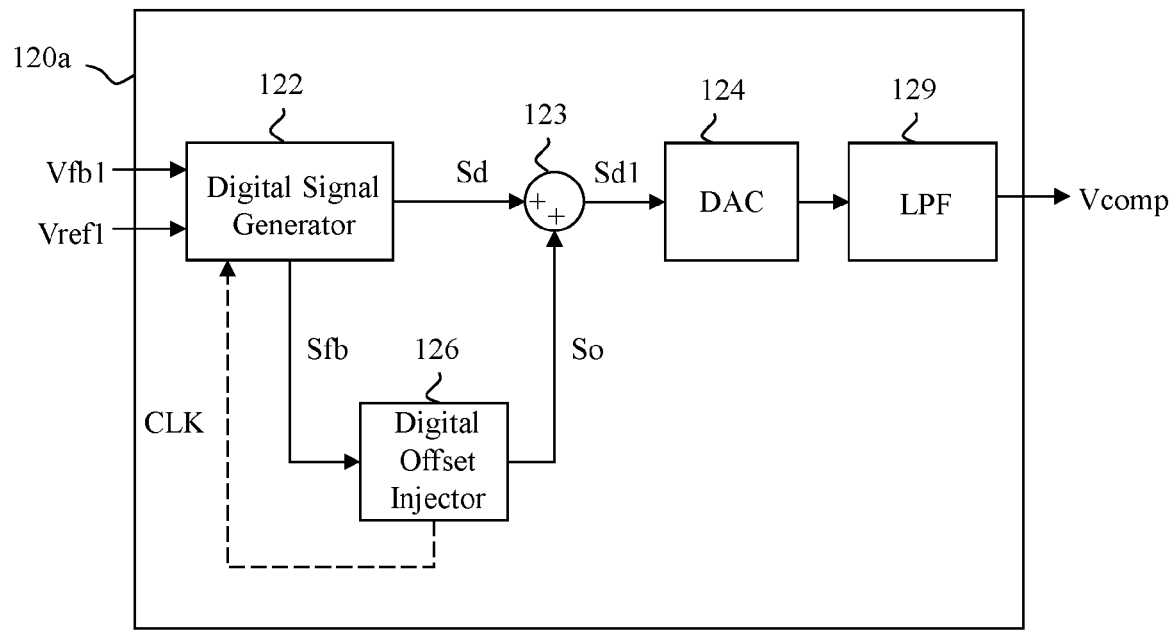

Referring to FIG. 12A, the mixed mode compensation circuit 120 includes a digital signal generator 122, an adder 123, a digital-to-analog converter (DAC) 124, a digital offset injector 126, and a digital filter 128, wherein the digital signal generator 122 functions as a first pole generator/compensator, the digital offset injector 126 functions as a zero generator/compensator, and the digital filter 128 functions as a second pole generator/compensator. This embodiment is different from the embodiment of FIG. 3A in that the zero generator/compensator and the second pole generator/compensator are embodied by digital circuits and are located before the DAC 124. However, it is not necessary for both of the zero generator/compensator and the second pole generator/compensator to be embodied by digital circuits; one of them, for example but not limited to the second pole generator/compensator, can be embodied by an analog circuit such as a low-pass filter. In this case the digital filter 128 can be replaced by a LPF 129, as shown by FIG. 12B.

Referring back to FIG. 12A, the digital signal generator 122 generates a digital signal Sd according to a reference signal Vref1 and a feedback signal Vfb1 related to an output voltage of a power converter. The digital offset injector 126 provides a variable offset value according to another output signal Sfb from the digital signal generator 122, which will be described in detail later. The digital filter 128 filters the output signal So from the digital offset injector 126 to generate a filtered offset value Sfo. The adder 123 adds the digital signal Sd with the filtered offset value Sfo to generate a digital signal Sd1, which is converted by the DAC 124 to the signal Vcomp.

Figure 12C:
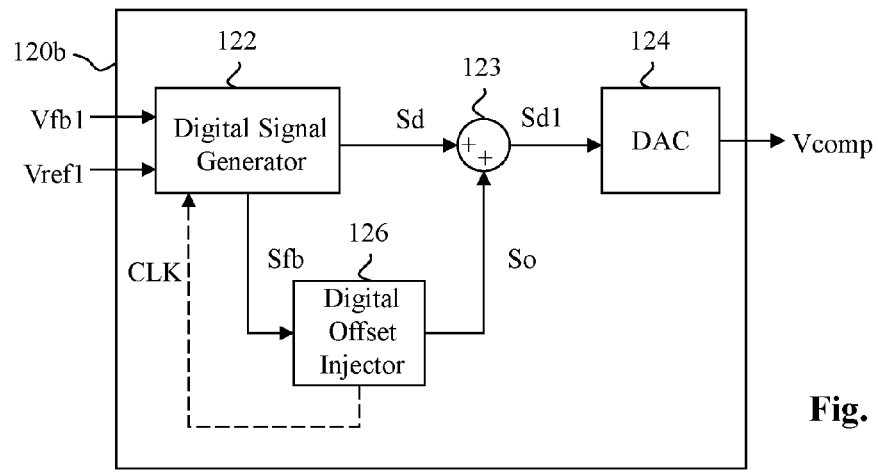
Figure 12D:
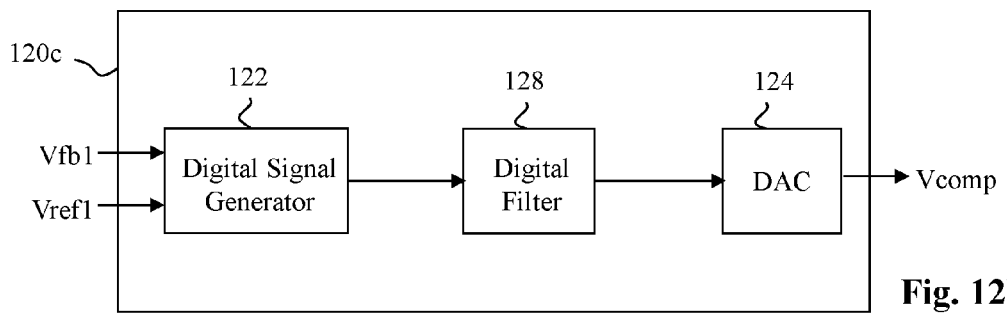
Figure 12E:
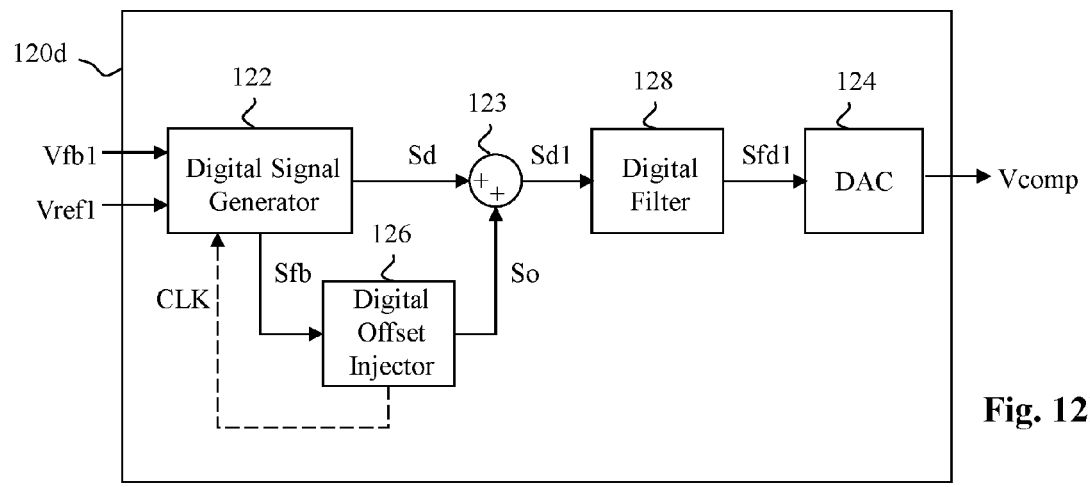

Note that it may not be necessarily required to generate/compensate two poles and one zero. In some applications, it may only be required to generate/compensate one pole, or one pole and one zero, or two poles. When it is only required to generate/compensate one pole, the circuits 123, 126 and 128 can be omitted, and it will result in a circuit as shown in FIG. 3B. When it is only required to generate/compensate one pole and one zero, the digital filter 128 can be omitted, and it will result in a circuit as shown in FIG. 12C. When it is only required to generate/compensate two poles, the adder 123 and the digital offset injector 126 can be omitted, and it will result in a circuit as shown in FIG. 12D. Furthermore, please note that the location of the digital filter 128 is not limited to that as shown in FIG. 12A; for example, the digital filter 128 can be located after the adder 123 (coupled to the output of the adder 123), as shown in FIG. 12E. In this case, the signal Sfd1 is a signal obtained by filtering the signal Sd1, so the signal Sfd1 can be regarded as a signal related to the signal Sd1.

Figure 12F:
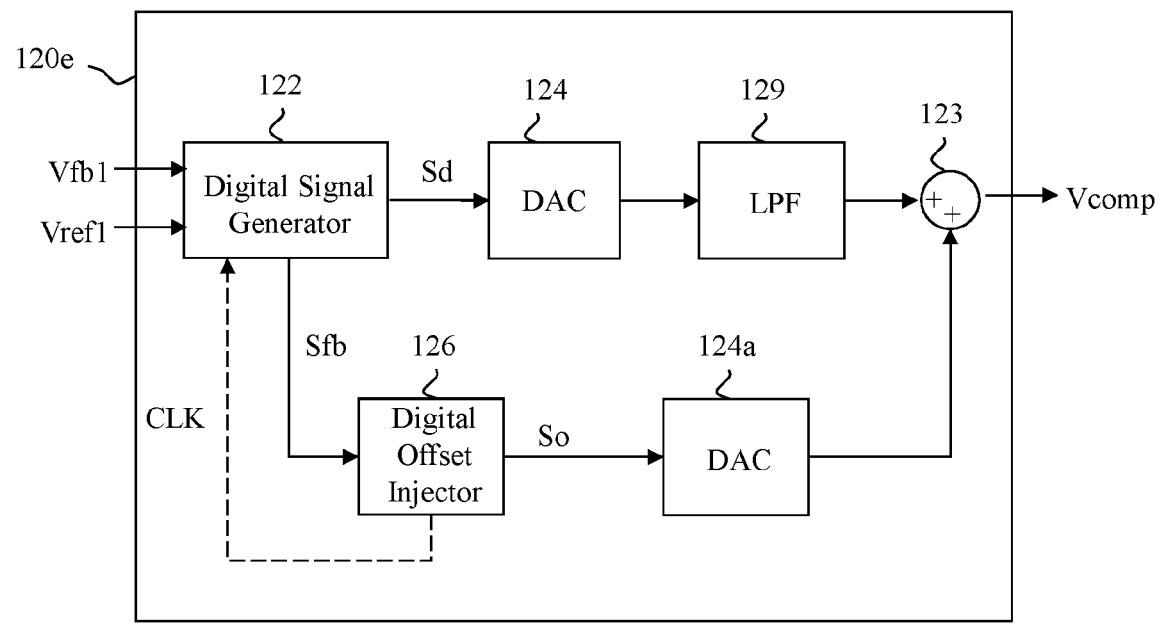
Figure 12G:
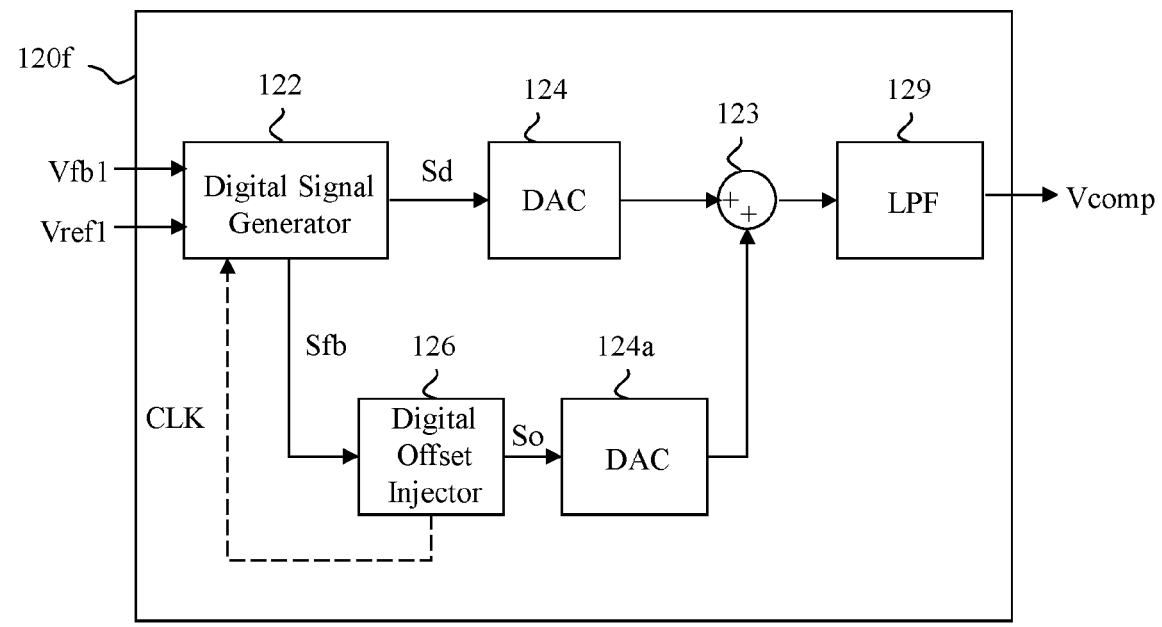

In addition to the above arrangements, as an alternative, the addition of digital signals can be equivalently achieved by first converting the digital signals to analog signals and then adding the converted analog signals. As shown in FIGS. 12F-12G, the output signal Sd from the digital signal generator 122 and the output signal So from the digital offset injector 126 are converted to analog signals by the DAC 124 and DAC 124a respectively, and then added together. The difference between FIGS. 12F and 12G is the location of the LPF 129 (in FIG. 12F, the output signal from the LPF 129 is a signal obtained by filtering the signal outputted from the DAC 124, so the output signal from the LPF 129 can be regarded as a signal related to the signal outputted from the DAC 124).

Figure 13:
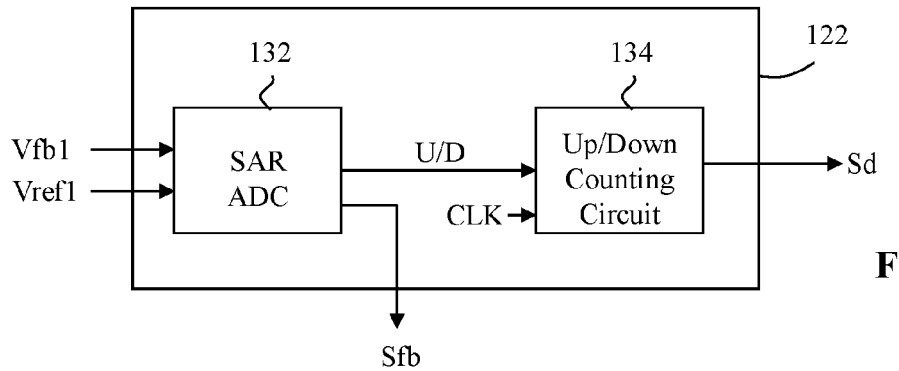
FIG. 13 shows an embodiment of the digital signal generator 122.

FIG. 13 shows an embodiment of the digital signal generator 122. As shown in the figure, in this embodiment, the digital signal generator 122 includes a successive approximation register analog-to-digital converter (SAR-ADC) 132 and an up/down counting circuit 134. The SAR-ADC 132 generates an up/down signal U/D according to the feedback signal Vfb1 and the reference signal Vref1. The up/down signal U/D controls the up/down counting circuit 134 so that the output signal of the up/down counting circuit 134 (which is the digital signal Sd) increases or decreases accordingly. The up/down counting circuit 134 operates according to a clock signal CLK. In the embodiments of FIGS. 12A-12C and 12E, optionally, the digital offset injector 126 may feedback control the frequency of the clock signal CLK, for example by generating the clock signal CLK by the digital offset injector 126, or by sending a signal to control an oscillator inside the digital signal generator 122 which generates the clock signal CLK.

The SAR-ADC 132 further generates another output signal Sfb. The signal Sfb is a digital signal corresponding to the feedback signal Vfb1, or corresponding to a difference between the feedback signal Vfb1 and the reference signal Vref1, which will be explained in detail in the following.

Figure 14A:
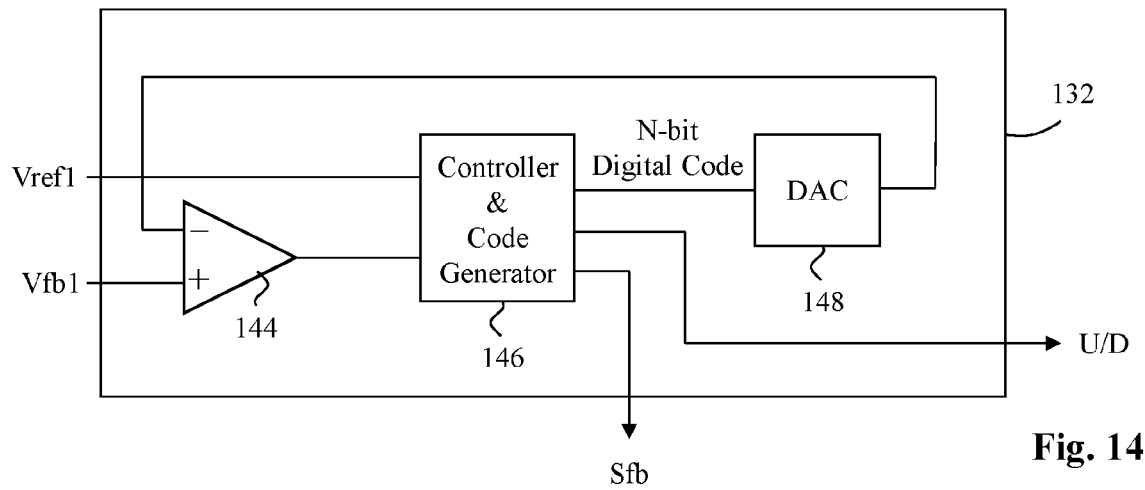
FIGS. 14A-14D show four embodiments of the SAR-ADC 132.

FIGS. 14A-14D show four embodiments of the SAR-ADC 132. In the embodiment of FIG. 14A, the reference signal Vref1 is a digital signal and the SAR-ADC 132 includes a comparator 144, a controller and code generator 146, and a DAC 148. The comparator 144 compares the feedback signal Vfb1 with an analog feedback signal generated by the DAC 148; in response to the output signal of the comparator 144, the controller and code generator 146 generates an N-bit digital code, which is sent to the DAC 148 so that the DAC 148 generates the analog feedback signal corresponding to the N-bit digital code. Thus, in a way, the N-bit digital code is a digital signal converted from the feedback signal Vfb1, so the circuit is called SAR-ADC. The controller and code generator 146 further generates a digital signal Sfb, wherein the digital signal Sfb can be the same or different from the N-bit digital code, that is, the digital signal Sfb can be N-bit or any other number of bits, and can be expressed by the same format as the N-bit digital code or by any other format. In a first embodiment, the digital signal Sfb also corresponds to the feedback signal Vfb1, and it can be viewed as a digital expression of the feedback signal Vfb1. By the feedback loop formed by the comparator 144, the controller and code generator 146, and the DAC 148, the digital signal Sfb can be an accurate digital number representing the feedback signal Vfb1. In addition, the controller and code generator 146 further receives the reference signal Vref1, and it generates an up/down signal U/D according to a comparison between the feedback signal Vfb1 and the reference signal Vref1. More specifically, because the reference signal Vref1 is a digital signal, and both the N-bit digital code and the digital signal Sfb are digital expressions of the feedback signal Vfb1, the comparison can be done by comparing the reference signal Vref1 with either the N-bit digital code or the digital signal Sfb in a digital manner, for example by subtracting one from the other. When the feedback signal Vfb1 is greater than the reference signal Vref1, that is, when the N-bit digital code or the digital signal Sfb is greater than the reference signal Vref1, the up/down signal U/D instructs the up/down counting circuit 134 to increase the digital signal Sd, for example by digital number one. When the feedback signal Vfb1 is smaller than the reference signal Vref1, that is, when the N-bit digital code or the digital signal Sfb is smaller than the reference signal Vref1, the up/down signal U/D instructs the up/down counting circuit 134 to decrease the digital signal Sd, for example by digital number one.

In a second embodiment, the digital signal Sfb corresponds to a difference between the feedback signal Vfb1 and the reference signal Vref1, and it can be viewed as a digital expression of the difference between the feedback signal Vfb1 and the reference signal Vref1. Likely, because the reference signal Vref1 is a digital signal, and the N-bit digital code is a digital expression of the feedback signal Vfb1, the difference can be obtained by comparing the reference signal Vref1 with the N-bit digital code in a digital manner, for example by subtracting one from the other. Or, the digital signal Sfb can be a coded expression of the difference. The rest of the circuit operates similar to the first embodiment wherein the digital signal Sfb corresponds to the feedback signal Vfb1.

Figure 14B:
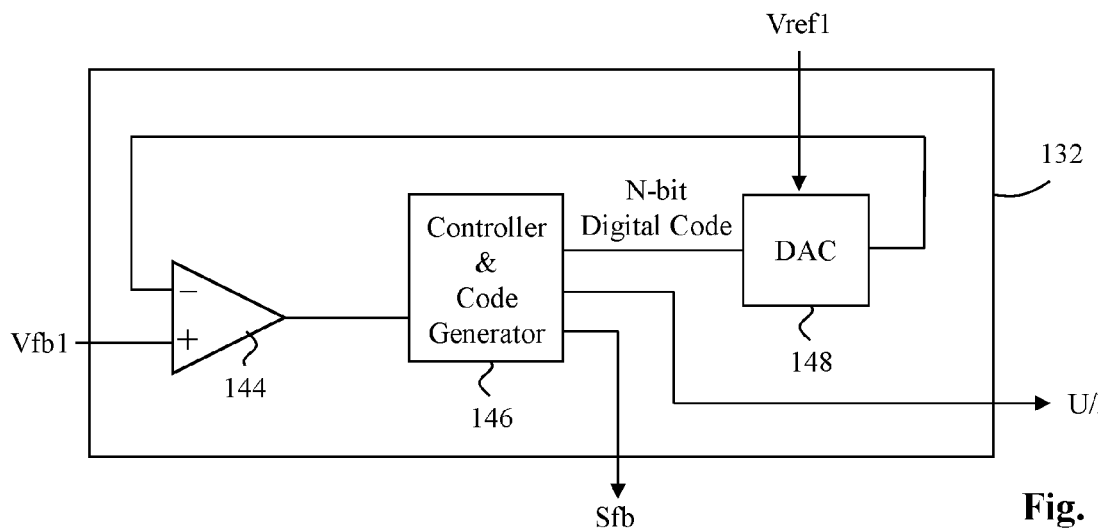

In the embodiment of FIG. 14B, the reference signal Vref1 is a digital signal which is inputted to the DAC 148 as an initial code number. Similarly, the digital signal Sfb can correspond to the feedback signal Vfb1 or correspond to the difference between the feedback signal Vfb1 and the reference signal Vref1 (that is, the digital signal Sfb can be a digital expression of the feedback signal Vfb1 or a digital expression of the difference between the feedback signal Vfb1 and the reference signal Vref1). The rest of the circuit operates similar to the embodiment of FIG. 14A.

Figure 14C:
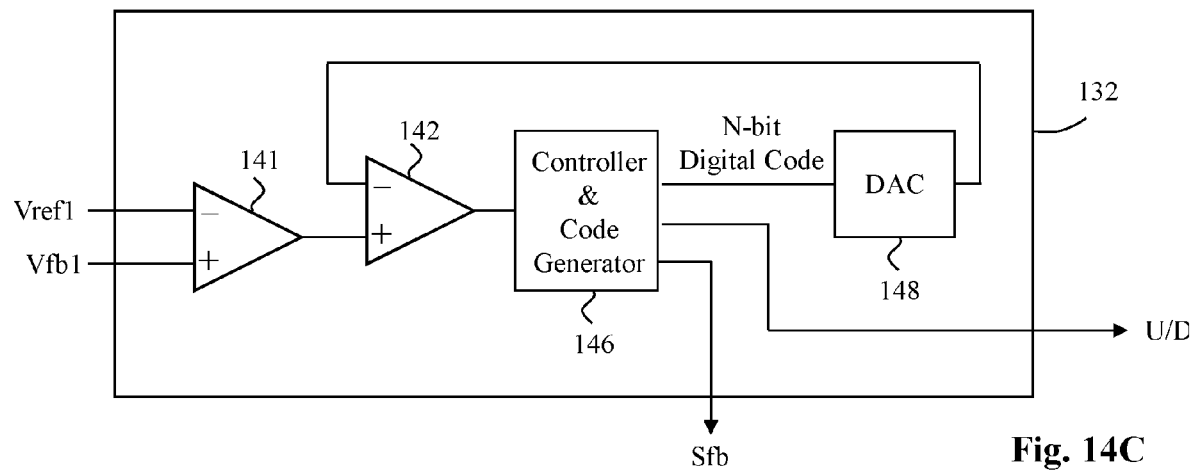

In the embodiment of FIG. 14C, the reference signal Vref1 is an analog signal and the SAR-ADC 132 includes an error amplifier 141, a comparator 142, a controller and code generator 146, and a DAC 148. The error amplifier 141 compares the feedback signal Vfb1 with the reference signal Vref1 to generate an error amplified signal. The comparator 142, the controller and code generator 146, and the DAC 148 form a SAR which operates similar to the embodiment of FIG. 14A, except that the digital signal Sfb is a digital expression of the difference between the feedback signal Vfb1 and the reference signal Vref1.

Figure 14D:
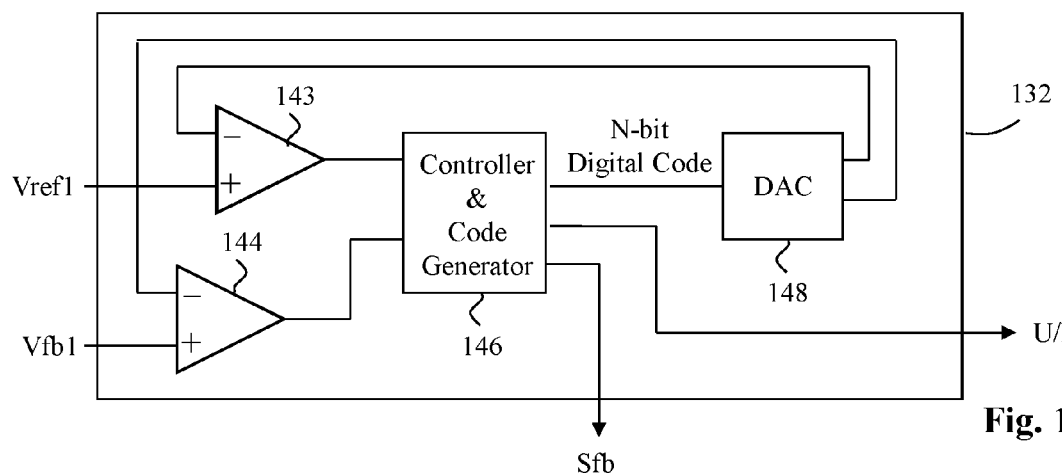

In the embodiment of FIG. 14D, the reference signal Vref1 is an analog signal and the SAR-ADC 132 includes two comparators 143 and 144, a controller and code generator 146, and a DAC 148. The comparator 143 compares the analog feedback signal generated by the DAC 148 with the reference signal Vref1, and the result is sent to the controller and code generator 146. This embodiment operates similar to the embodiment of FIG. 14A, except that the controller and code generator 146 receives the output signal of the comparator 143 instead of a digital reference signal Vref1.

Figure 15:
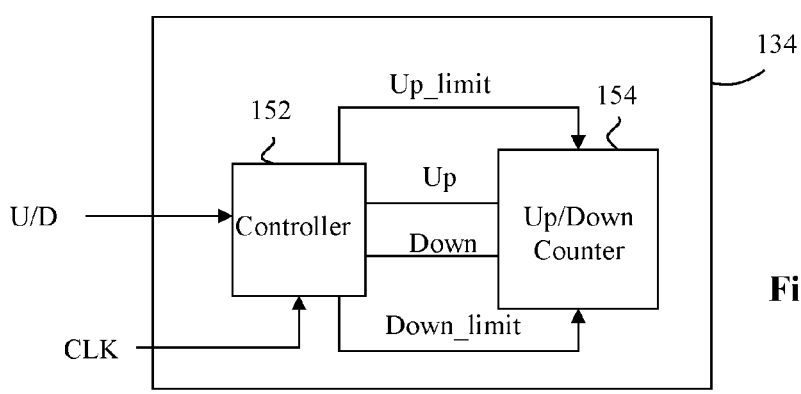
FIG. 15 shows an embodiment of the up/down counting circuit 134.

FIG. 15 shows an embodiment of the up/down counting circuit 134. The up/down counting circuit 134 includes a controller 152 and an up/down counter 154. The controller 152 is controlled by the up/down signal U/D, and it operates by a frequency determined by a clock signal CLK. The relationship between the controller 152 and an up/down counter 154 is similar to the relationship between the controller 42 and an up/down counter 44, and therefore is not redundantly repeated here.

Figure 16A:
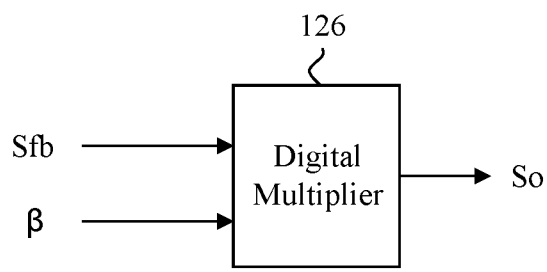
FIGS. 16A-16I shows nine embodiments of the digital offset injector 126.

FIG. 16A shows an embodiment of the digital offset injector 126. As explained in the above, the digital offset injector 126 functions as a zero generator/compensator by providing a variable offset value, wherein the variable offset value is related to the difference between the feedback signal Vfb1 and the reference signal Vref1. Therefore, the digital offset injector 126 can be designed in many ways as long as it can generate a digital number or code which corresponds to, or is a digital expression, of $\alpha \cdot (Vfb1-Vref1)$, wherein $\alpha$ is a positive real number indicating a scale factor corresponding to the transconductance of the transconductance amplifier 16 multiplied by the resistance of the resistor R3 in the analog circuit of FIG. 2. As shown in FIG. 16A, in one embodiment, the digital offset injector 126 can be embodied as a digital multiplier which multiplies the digital signal Sfb by a factor $\beta$ which is a positive real number to generate the variable offset value So. (Or, if the factor $\beta$ is a positive real number smaller than 1, the digital multiplier can be a divider which divides the digital signal Sfb by a factor $1/\beta$.) In this embodiment the digital signal Sfb corresponds to, or is a digital expression of the difference between the feedback signal Vfb1 and the reference signal Vref1. The factor $\beta$ can be given by a designer of the mixed mode compensation circuit. The variable offset value So outputted from the digital multiplier is equal to $\beta \cdot Sfb$, which corresponds to $\alpha \cdot (Vfb1-Vref1)$.

Figure 16B:
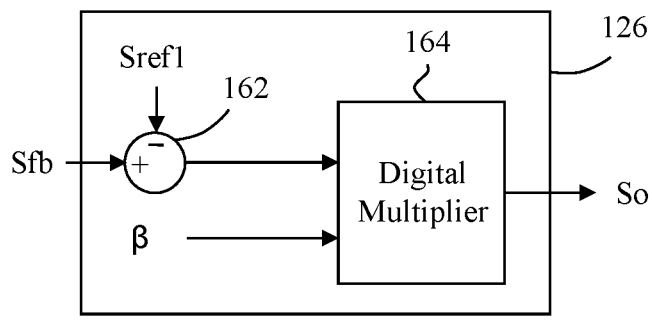

In another embodiment as shown in FIG. 16B, wherein the digital signal Sfb corresponds to, or is a digital expression of the feedback signal Vfb1, the digital offset injector 126 includes an adder/subtractor 162 and a digital multiplier 164. The adder/subtractor 162 subtracts a digital signal Sref1 from the digital signal Sfb, wherein the digital signal Sref1 corresponds to, or is a digital expression of the reference signal Vref1. The digital multiplier 164 multiplies the difference between the digital signal Sfb and the digital signal Sref1 by a factor $\beta$. The variable offset value So outputted from the digital multiplier is equal to $\beta \cdot (Sfb-Sref1)$, which corresponds to $\alpha \cdot (Vfb1-Vref1)$.

Figure 16C:
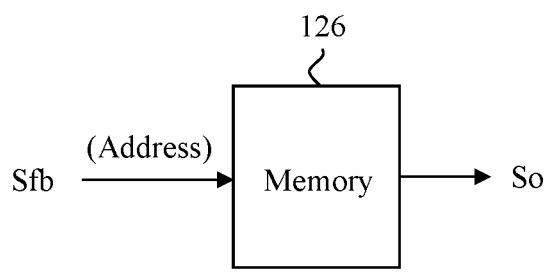

Besides the above embodiments, the digital offset injector 126 can be embodied by many other ways; for example, the digital offset injector 126 can be embodied as a memory with different pre-stored offset values at different addresses, and the digital signal Sfb can be the address, or can be used to generate the address of the memory, as shown in FIG. 16C. The digital signal Sfb can correspond either to the feedback signal Vfb1 or to the difference between the feedback signal Vfb1 and the reference signal Vref1.

Figure 16D:
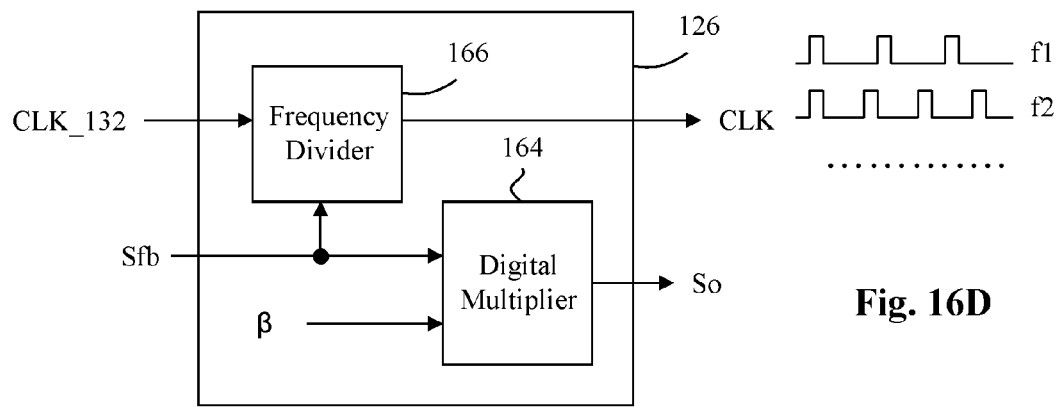
Figure 16E:
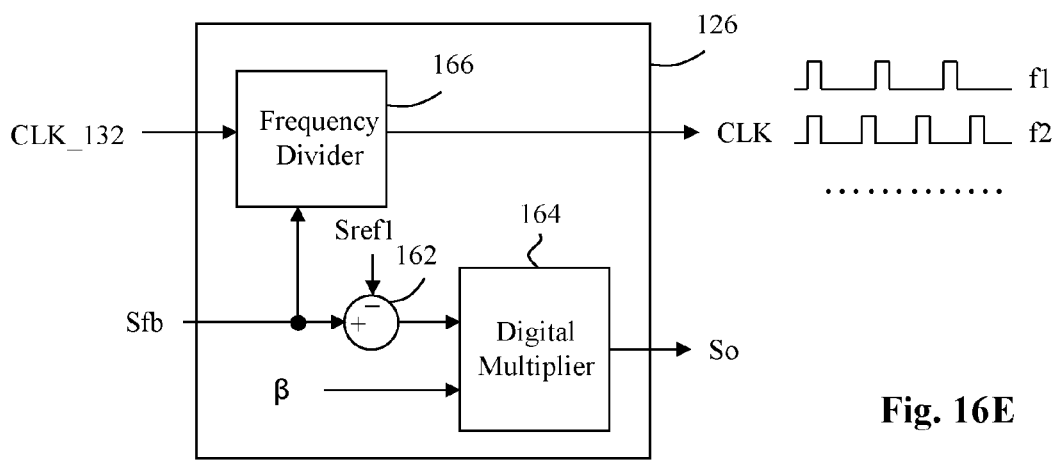
Figure 16F:
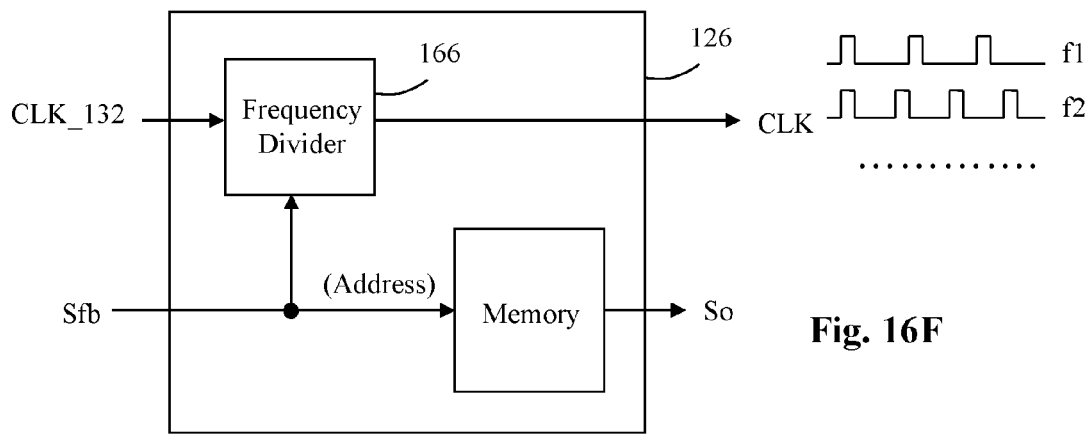

FIGS. 16D-16F shows three other embodiments of the digital offset injector 126. Referring to FIG. 16D, the digital offset injector 126 of this embodiment includes a digital multiplier 164 and a frequency divider 166. The digital multiplier 164 operates in a manner similar to the embodiment of FIG. 16A. The frequency divider 166 receives a clock signal CLK_132, which is the clock signal by which the SAR-ADC 132 operates (for example, by which the DAC 148 of the SAR-ADC 132 operates). The frequency divider 166 divides the clock signal CLK_132 to generate a frequency-divided clock signal CLK. The generated clock signal CLK has a different frequency f1, f2, . . . , depending on the digital signal Sfb. That is, the frequency of the clock signal CLK is dependent on the digital signal Sfb. The clock signal CLK is sent to the up/down counting circuit 134 (referring to FIGS. 12A-12C, 12E, 13 and 15) so that the controller 152 operates according to this clock signal CLK. In this way, the digital offset injector 126 modulates the frequency by which the up/down counting circuit 134 operates, which provides an effect similar to the capacitor C1 in FIG. 2.

FIGS. 16E and 16F correspond to FIGS. 16B and 16C, except that the digital offset injector 126 also includes a frequency divider 166 to generate a frequency-divided clock signal CLK. The frequency divider 166 operates similarly to the embodiment of FIG. 16D. Note that in the embodiment of FIG. 16E, instead of dividing the clock signal CLK_132 according to the digital signal Sfb as shown, as an alternative (not shown, but referring to FIG. 16H), the frequency divider 166 can divide the clock signal CLK_132 according to the output from the adder/subtractor 162. In this alternative case, because the digital signal Sref1 corresponds to the reference signal Vref1 which is a known signal, the frequency of the clock signal CLK is still dependent on the digital signal Sfb.

Figure 16G:
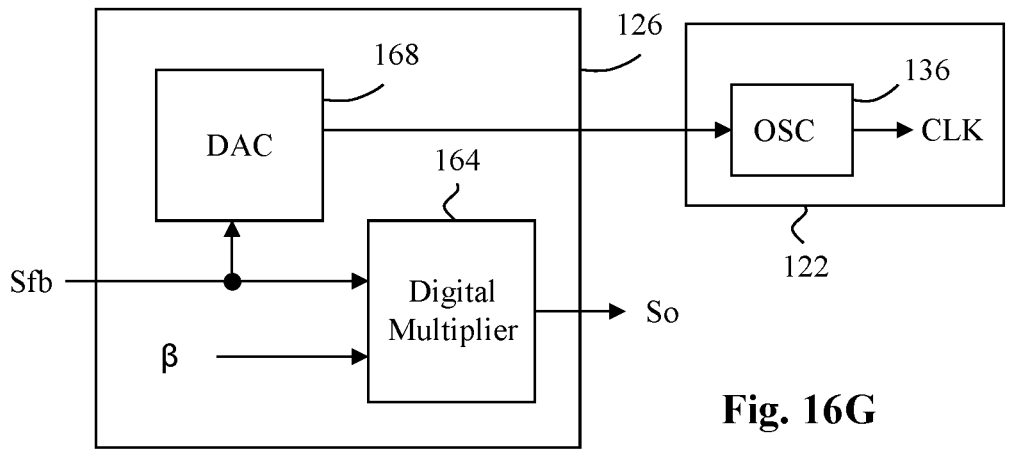
Figure 16H:
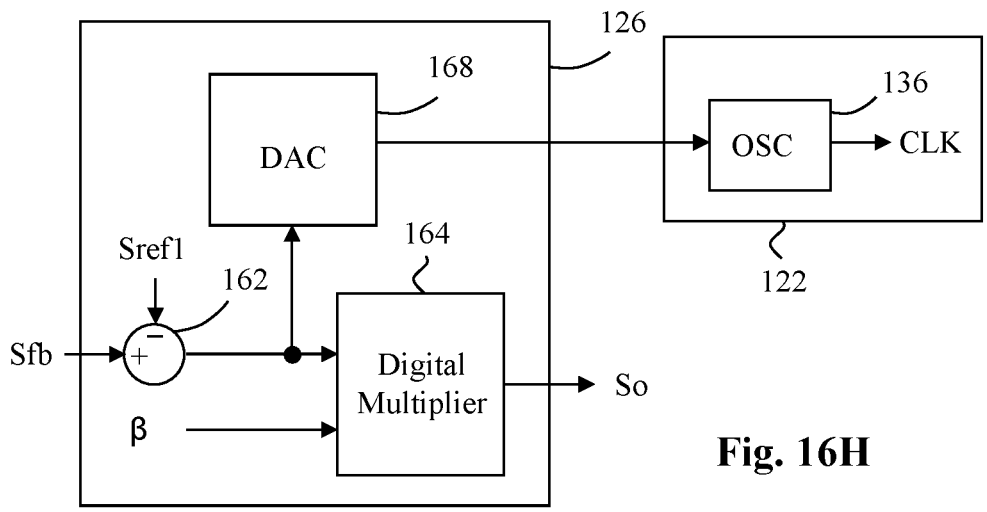
Figure 16I:
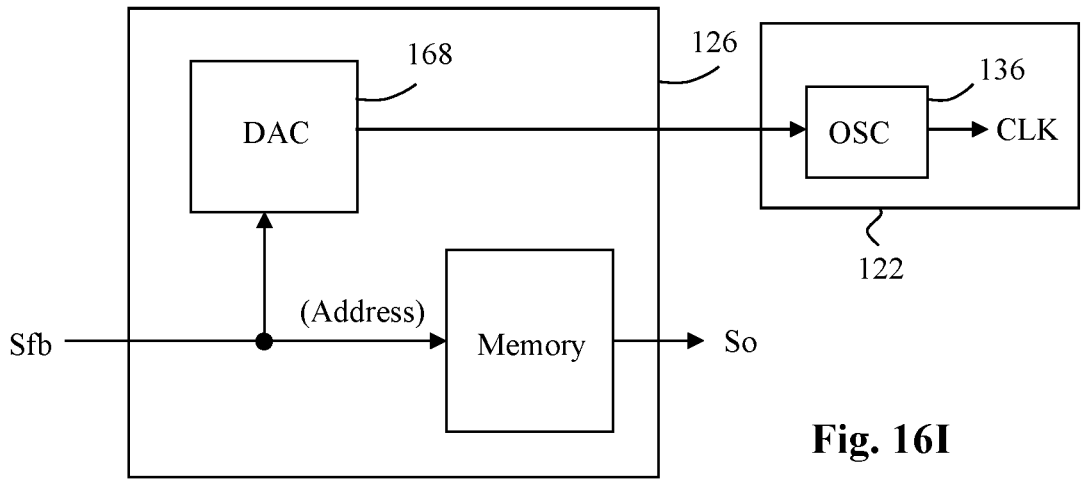

FIGS. 16G-16I shows three other embodiments of the digital offset injector 126. Referring to FIG. 16G, the digital offset injector 126 of this embodiment includes a digital multiplier 164 and a DAC 168. The digital multiplier 164 operates in a manner similar to the embodiment of FIG. 16A. The DAC 168 converts the digital signal Sfb to an analog signal, which may be a current signal or a voltage signal. In addition, the digital signal generator 122 includes an oscillator (OSC) 136, which may be a current-controlled oscillator or a voltage-controlled oscillator, depending on whether the DAC 168 generates a current signal or a voltage signal. The signal generated by the DAC 168 controls the OSC 136 to determine the frequency of the clock signal CLK generated by the OSC 136. The clock signal CLK is what the up/down counting circuit 134 operates by. In this way, the digital offset injector 126 also can modulate the operation frequency of the up/down counting circuit 134 to provide an effect similar to the capacitor C1 in FIG. 2.

FIGS. 16H and 16I correspond to FIGS. 16B and 16C, except that the digital offset injector 126 also includes a DAC 168 and the digital signal generator 122 also includes an OSC 136. The DAC 168 and the OSC 136 operate similarly to the embodiment of FIG. 16G. Note that in the embodiment of FIG. 16H, the DAC 168 converts the output from the adder/subtractor 162 to the analog signal for controlling the OSC 136. In an alternative arrangement, the DAC 168 can convert the digital signal Sfb to the analog signal for controlling the OSC 136.

Figure 17A:
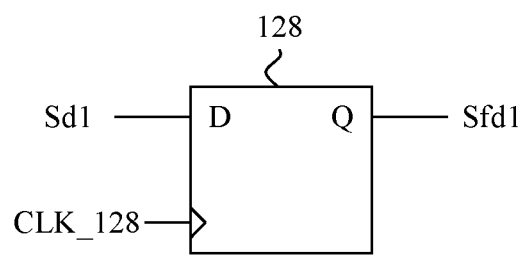
FIGS. 17A and 17B show two embodiments of the digital filter 128.
Figure 17B:
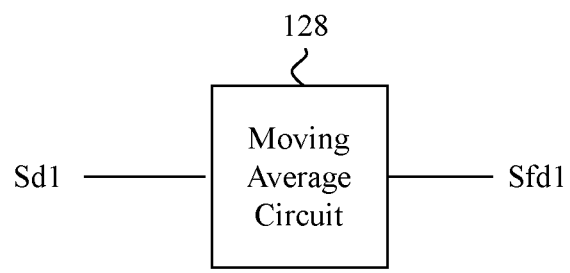

FIGS. 17A and 17B shows two embodiments of the digital filter 128. Referring to FIG. 17A, in a simple form, the digital filter 128 can be embodied as a D flip-flop. Taking the embodiment of FIG. 12E for example, wherein the digital filter 128 is connected between the adder 123 and the DAC 124, to receive the digital signal Sd1 and generate a filtered digital signal Sfd1, the digital signal Sd1 can be inputted to the D flip-flop. The D flip-flop operates according to a clock signal CLK_128, which has a slower frequency than the clock signal CLK_132 by which the SAR-ADC 132 operates, and more preferably slower than the clock signal CLK by which the up/down counting circuit 134 operates. (Note that the numbers 128 and 132 are irrelevant to the ratio between the clock signals; they only indicate the circuits using these clock signals.) Because the D flip-flop operates by a slower frequency, it provides an effect similar to the capacitor C2 in FIG. 2.

Referring to FIG. 17B, in a more sophisticated form, the digital filter 128 can be embodied as a moving average circuit. Also taking the embodiment of FIG. 12E for example, the moving average circuit receives the digital signal Sd1 and generates a filtered digital signal Sfd1 by obtaining a moving average of the digital signal Sd1. There are many ways to calculate a moving average; one example is as below:

$$Sfd1_t = sum_t/n = (sum_{(t-1)} - Sfd1_{(t-1)} + Sfd_t)/n \qquad [EQ-3]$$

wherein $Sfd1_t$ and $Sfd1_{(t-1)}$ are the digital signal Sfd1 at the present time point and the digital signal Sfd1 at the previous time point, respectively; $Sfd_t$ is the digital signal Sfd at the present time point; $Sum_t$ and $Sum_{(t-1)}$ are the accumulated sum at the present time point and the accumulated sum at the previous time point, respectively; and n is the divider which is typically a positive integer to determine the smoothness and the approaching speed of the moving average.

Although FIGS. 17A and 17B takes the embodiment of FIG. 12E for example, it can be readily understood that the circuit of FIG. 17A or 17B is applicable to other embodiments.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other circuits or devices, such as but not limited to a switch or the like, can be added between two circuits or devices shown to be in direct connection is the embodiments, as long as these added circuits or devices do not affect the primary function. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

The invention claimed is:

1. A mixed mode compensation circuit for a power converter, comprising:
   a digital signal generator for generating a first digital signal and a second digital signal according to a reference signal and an output voltage feedback signal which is related to an output voltage of the power converter;
   a digital offset injector coupled to the digital signal generator, for generating a variable offset according to the second digital signal;
   an adder for adding the first digital signal and the variable offset or for adding the first digital signal and a signal related to the variable offset; and
   a digital-to-analog converter coupled to the adder, for converting an output of the adder or a signal related to the output of the adder into an analog signal.

2. The mixed mode compensation circuit of claim 1, further comprising: a low-pass filter coupled to the digital-to-analog converter for filtering out high-frequency components of the analog signal.

3. The mixed mode compensation circuit of claim 1, further comprising:
   (1) a digital filter coupled between the digital offset injector and the adder for filtering the variable offset to generate the signal related to the variable offset; or (2) a digital filter coupled between the adder and the digital-to-analog converter for filtering the output of the adder to generate the signal related to the output of the adder.

4. The mixed mode compensation circuit of claim 1, wherein the digital offset injector generates a digital number or code corresponding to α·(Vfb1−Vref1), wherein α is a positive real number; Vfb1 is the output voltage feedback signal; and Vref1 is the reference signal.

5. The mixed mode compensation circuit of claim 1, wherein the digital offset injector includes a digital multiplier for multiplying the second digital signal by a factor β to generate the variable offset, wherein β is a positive real number.

6. The mixed mode compensation circuit of claim 1, wherein the digital offset injector includes:
an adder/subtractor subtracting a third digital signal corresponding to the reference signal from the second digital signal to obtain a difference;
a digital multiplier multiplying the difference by a factor β to generate the variable offset, wherein β is a positive real number.

7. The mixed mode compensation circuit of claim 1, wherein the digital offset injector includes:
a memory having a plurality of addresses storing a plurality of offsets, and the second digital signal being or determining one of the addresses; and
a digital-to-analog converter for converting the second digital signal into an analog signal to control a frequency of the oscillator.

8. The mixed mode compensation circuit of claim 1, wherein the digital offset injector feedback controls a clock signal of the digital signal generator.

9. The mixed mode compensation circuit of claim 8, wherein the digital signal generator further comprises an oscillator for generating the clock signal, and the digital offset injector includes:
a digital multiplier multiplying the second digital signal by a factor β to generate the variable offset, wherein β is a positive real number; and
a digital-to-analog converter for converting the second digital signal into an analog signal to control a frequency of the oscillator.

10. The mixed mode compensation circuit of claim 8, wherein the digital signal generator further comprises an oscillator for generating the clock signal, and the digital offset injector includes:
an adder/subtractor subtracting a third digital signal corresponding to the reference signal from the second digital signal to obtain a difference;
a digital multiplier multiplying the difference by a factor β to generate the variable offset, wherein β is a positive real number; and
a digital-to-analog converter for converting the second digital signal or the third digital signal into an analog signal to control a frequency of the oscillator.

11. The mixed mode compensation circuit of claim 8, wherein the digital signal generator further comprises an oscillator for generating the clock signal, and the digital offset injector includes:
a memory having a plurality of addresses storing a plurality of offsets, and the second digital signal being or determining one of the addresses; and
a digital-to-analog converter for converting the second digital signal into an analog signal to control a frequency of the oscillator.

12. The mixed mode compensation circuit of claim 1, wherein the digital signal generator includes:
a SAR-ADC for generating an up/down signal according to the output voltage feedback signal and the reference signal; and
an up/down counter having an output controlled by the up/down signal to correspondingly increase or decrease.

13. The mixed mode compensation circuit of claim 12, wherein the SAR-ADC operates according to a first clock signal and the up/down counter operates according to a second clock signal, and wherein the digital offset injector includes:
a digital multiplier multiplying the second digital signal by a factor β to generate the variable offset, wherein β is a positive real number; and
a frequency divider circuit for dividing a frequency of the first clock signal according to the second digital signal to generate the second clock signal.

14. The mixed mode compensation circuit of claim 12, wherein the SAR-ADC operates according to a first clock signal and the up/down counter operates according to a second clock signal, and wherein the digital offset injector includes:
an adder/subtractor subtracting a third digital signal corresponding to the reference signal from the second digital signal to obtain a difference;
a digital multiplier multiplying the difference by a factor β to generate the variable offset, wherein β is a positive real number; and
a frequency divider circuit for dividing a frequency of the first clock signal according to the second digital signal or the third digital signal to generate the second clock signal.

15. The mixed mode compensation circuit of claim 12, wherein the SAR-ADC operates according to a first clock signal and the up/down counter operates according to a second clock signal, and wherein the digital offset injector includes:
a memory having a plurality of addresses storing a plurality of offsets, and the second digital signal being or determining one of the addresses; and
a frequency divider circuit for dividing a frequency of the first clock signal according to the second digital signal to generate the second clock signal.

16. The mixed mode compensation circuit of claim 3, wherein the digital filter includes a D flip-flop.

17. The mixed mode compensation circuit of claim 16, wherein the digital signal generator includes:
a SAR-ADC for generating an up/down signal according to the output voltage feedback signal and the reference signal, the SAR-ADC operating according to a first clock signal; and
an up/down counter having an output controlled by the up/down signal to correspondingly increase or decrease, the up/down counter operating according to a second clock signal,
wherein the D flip-flop operates according to a third clock signal which has a frequency lower than the first and the second clock signals.

18. The mixed mode compensation circuit of claim 3, wherein the digital filter includes a moving average circuit.

* * * * *